(12) United States Patent
Yamazaki

(10) Patent No.: US 8,946,097 B2
(45) Date of Patent: *Feb. 3, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/860,938

(22) Filed: Apr. 11, 2013

(65) Prior Publication Data

US 2013/0237013 A1    Sep. 12, 2013

Related U.S. Application Data

(63) Continuation of application No. 12/958,671, filed on Dec. 2, 2010, now Pat. No. 8,420,553.

(30) Foreign Application Priority Data

Dec. 8, 2009    (JP) .................................. 2009-279002

(51) Int. Cl.
*H01L 21/469* (2006.01)
*H01L 21/31* (2006.01)
(Continued)

(52) U.S. Cl.
CPC ...... *H01L 29/66969* (2013.01); *H01L 21/3003* (2013.01); *H01L 29/7869* (2013.01); *H01L 27/1225* (2013.01)
USPC ............ 438/787; 438/770; 438/795; 438/585

(58) Field of Classification Search
CPC .................................................. H01L 21/02565
USPC .................................. 438/787, 770, 795, 585
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 737 044 A | 12/2006 |
| EP | 2068367 A | 6/2009 |

(Continued)

OTHER PUBLICATIONS

International Search Report (Application No. PCT/JP2010/070254) dated Dec. 28, 2010.

(Continued)

*Primary Examiner* — Luan C Thai
(74) *Attorney, Agent, or Firm* — Eric J. Robinson; Robinson Intellectual Property Law Office, P.C.

(57) ABSTRACT

A manufacturing method of a semiconductor device, which includes the steps of forming a gate electrode layer over a substrate having an insulating surface, forming a gate insulating layer over the gate electrode layer, forming an oxide semiconductor layer over the gate insulating layer, forming a source electrode layer and a drain electrode layer over the oxide semiconductor layer, forming an insulating layer including oxygen over the oxide semiconductor layer, the source electrode layer, and the drain electrode layer, and after formation of an insulating layer including hydrogen over the insulating layer including oxygen, performing heat treatment so that hydrogen in the insulating layer including hydrogen is supplied to at least the oxide semiconductor layer.

56 Claims, 12 Drawing Sheets

(51) Int. Cl.
   *H01L 21/324* (2006.01)
   *H01L 21/4763* (2006.01)
   *H01L 29/66* (2006.01)
   *H01L 21/30* (2006.01)
   *H01L 29/786* (2006.01)
   *H01L 27/12* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,569,780 B2 | 5/2003 | Tanabe et al. |
| 6,727,522 B1 | 4/2004 | Kawasaki et al. |
| 7,049,190 B2 | 5/2006 | Takeda et al. |
| 7,053,007 B2 | 5/2006 | Tanabe et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,524,713 B2 | 4/2009 | Miyairi et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,767,505 B2 | 8/2010 | Son et al. |
| 7,791,074 B2 | 9/2010 | Iwasaki |
| 7,910,920 B2 | 3/2011 | Park et al. |
| 8,115,206 B2 | 2/2012 | Sakakura et al. |
| 8,193,031 B2 | 6/2012 | Hosoba et al. |
| 8,207,014 B2 | 6/2012 | Sasaki et al. |
| 8,216,878 B2 | 7/2012 | Sasaki et al. |
| 8,389,326 B2 | 3/2013 | Sasaki et al. |
| 8,389,417 B2 | 3/2013 | Yamazaki et al. |
| 8,394,671 B2 | 3/2013 | Sasaki et al. |
| 8,410,002 B2 | 4/2013 | Yamazaki et al. |
| 8,420,553 B2 * | 4/2013 | Yamazaki ............ 438/787 |
| 8,513,054 B2 | 8/2013 | Sasaki et al. |
| 8,592,251 B2 | 11/2013 | Hosoba et al. |
| 8,614,442 B2 | 12/2013 | Park et al. |
| 8,623,698 B2 | 1/2014 | Sasaki et al. |
| 8,624,245 B2 | 1/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 * | 3/2007 | Akimoto et al. ........ 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246064 A1 | 10/2008 | Kimura |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0261444 A1 | 10/2009 | Yamazaki et al. |
| 2009/0278122 A1 | 11/2009 | Hosono et al. |
| 2009/0280600 A1 | 11/2009 | Hosono et al. |
| 2009/0289341 A1 | 11/2009 | Yamazaki et al. |
| 2009/0310734 A1 | 12/2009 | Umezaki |
| 2010/0051938 A1 | 3/2010 | Hayashi et al. |
| 2010/0051940 A1 | 3/2010 | Yamazaki et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0163874 A1 | 7/2010 | Koyama et al. |
| 2010/0219411 A1 | 9/2010 | Hoffman et al. |

FOREIGN PATENT DOCUMENTS

| | | |
|---|---|---|
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| JP | 2002-076356 | A | 3/2002 |
|---|---|---|---|
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-108169 | A | 4/2006 |
| JP | 2007-096055 | A | 4/2007 |
| JP | 2007-103918 | | 4/2007 |
| JP | 2007-123861 | A | 5/2007 |
| JP | 2007-194594 | A | 8/2007 |
| JP | 2007-529119 | | 10/2007 |
| JP | 2008-281988 | A | 11/2008 |
| JP | 2009-253159 | A | 10/2009 |
| JP | 2009-278078 | A | 11/2009 |
| KR | 2008-0076608 | A | 8/2008 |
| KR | 2009-0057690 | A | 6/2009 |
| WO | WO 2004/114391 | | 12/2004 |
| WO | WO 2005/093850 | | 10/2005 |
| WO | WO 2008/126879 | | 10/2008 |

OTHER PUBLICATIONS

Written Opinion (Application No. PCT/JP2010/070254) dated Dec. 28, 2010.
Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda et al., "Full-Functional System Liquid Crystal Display Using CG-Silicon Technology," SID Digest '04: SID International Symposium Digest of Technical Papers, 2004, vol. 35, pp. 860-863.
Nomura et al., "Room-Temperature Fabrication of Transparent Flexible Thin-Film Transistors Using Amorphous Oxide Semiconductors," Nature, Nov. 25, 2004, vol. 432, pp. 488-492.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Prins et al., "A Ferroelectric Transparent Thin-Film Transistor," Appl. Phys. Lett. (Applied Physics Letters), Jun. 17, 1996, vol. 68, No. 25, pp. 3650-3652.
Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.
Kimizuka et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Nomura et al., "Thin-Film Transistor Fabricated in Single-Crystalline Transparent Oxide Semiconductor," Science, May 23, 2003, vol. 300, No. 5623, pp. 1269-1272.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Tsuda et al., "Ultra Low Power Consumption Technologies for Mobile TFT-LCDs," IDW '02: Proceedings of the 9$^{th}$ International Display Workshops, Dec. 4, 2002, pp. 295-298.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Park et al., "High performance amorphous oxide thin film transistors with self-aligned top-gate structure," IEDM 09: Technical Digest of International Electron Devices Meeting, Dec. 7, 2009, pp. 191-194.
Kurokawa et al., "UHF RFCPUs on Flexible and Glass Substrates for Secure RFID Systems," Journal of Solid-State Circuits, 2008, vol. 43, No. 1, pp. 292-299.
Ohara et al., "Amorphous In—Ga—Zn—Oxide TFTs with Suppressed Variation for 4.0 inch QVGA AMOLDED Display," AM-FPD '09 Digest of Technical Papers, Jul. 1, 2009, pp. 227-230, The Japan Society of Applied Physics.
Coates et al., "Optical Studies of the Amorphous Liquid—Cholesteric Liquid Crystal Transition: The "Blue Phase"," Physics Letters, Sep. 10, 1973, vol. 45A, No. 2, pp. 115-116.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In—Ga—Zn—Oxide TFTs," IDW '09: Proceedings of the 16$^{th}$ International Display Workshops, 2009, pp. 689-692.
Park et al., "Amorphous Indium—Gallium—Zinc Oxide TFTs and their Application for Large Size AMOLED," AM-FPD '08 Digest of Technical Papers, Jul. 2, 2008, pp. 275-278.

(56) References Cited

OTHER PUBLICATIONS

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: a hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Korean Office Action (Application No. 2013-7020034) Dated Jul. 29, 2014.

* cited by examiner

SEMICONDUCTOR DEVICE AND MANUFACTURING METHOD THEREOF

TECHNICAL FIELD

The present invention relates to a semiconductor device which includes a circuit including at least a semiconductor element such as a transistor as an element, and a manufacturing method thereof. For example, the present invention relates to an electronic device in which a power device mounted in a power circuit; a semiconductor integrated circuit including a memory, a thyristor, a converter, an image sensor, or the like; an electro-optical device typified by a liquid crystal display panel; or a light-emitting display device including an organic light-emitting element is included as a part.

In this specification, a semiconductor device means any device which can function by utilizing semiconductor characteristics, and an electro-optical device, a semiconductor circuit, and an electronic device are all semiconductor devices.

BACKGROUND ART

Transistors formed over a glass substrate or the like have been manufactured using amorphous silicon, polycrystalline silicon, or the like, as typically seen in liquid crystal display devices. Although transistors manufactured using amorphous silicon have low field-effect mobility, they have an advantage of being able to use larger glass substrates. Further, although transistors manufactured using polycrystalline silicon have high field-effect mobility, they have a disadvantage of not being suitable for large glass substrates.

In contrast to the transistors manufactured using silicon, a technique in which a transistor is manufactured using an oxide semiconductor and applied to an electronic device or an optical device has attracted attention. For example, Patent Document 1 and Patent Document 2 disclose a technique in which a transistor is manufactured using zinc oxide or an In—Ga—Zn—O-based oxide semiconductor as an oxide semiconductor and such a transistor is used as a switching element or the like in a pixel of a display device.

REFERENCE

Patent Document

[Patent Document 1] Japanese Published Patent Application No. 2007-123861
[Patent Document 2] Japanese Published Patent Application No. 2007-96055

DISCLOSURE OF INVENTION

Further, large-sized display devices have increasingly become popular. Home-use televisions with a display screen diagonal of 40 inches to 50 inches have started to spread.

The field-effect mobility of a transistor manufactured using a conventional oxide semiconductor is 10 $cm^2/Vs$ to 20 $cm^2/Vs$. The field-effect mobility of a transistor manufactured using an oxide semiconductor is ten times or more as large as that of a transistor manufactured using amorphous silicon. Therefore, the transistor manufactured using an oxide semiconductor can provide a performance sufficient as a pixel switching element even in a large-sized display device.

However, there has been a limit to the transistor manufactured using an oxide semiconductor when being used as a switching element in a driving device of a semiconductor device, for example, in a driver circuit of a large-sized display device.

An object of an embodiment of the present invention is to enable the manufacture of a transistor having a desirably high field-effect mobility through formation of an oxide semiconductor layer having improved characteristics as well as enabling the increase in size of the substrate and also to put a large-sized display device, a high-performance semiconductor device, or the like into practical use.

A feature of an embodiment of the present invention is, in a transistor using an oxide semiconductor layer for a channel formation region, that an insulating layer in contact with the oxide semiconductor layer and an insulating layer including hydrogen in contact with the insulating layer are stacked; and hydrogen in the insulating layer including hydrogen is supplied to at least one of an interface between a gate insulating layer and the oxide semiconductor layer, the oxide semiconductor layer, and the interface between the oxide semiconductor layer and the insulating layer, whereby characteristics of the transistor are improved.

Another embodiment of the present invention is a manufacturing method of a semiconductor device, including the steps of forming a gate electrode layer over a substrate having an insulating surface; forming a gate insulating layer over the gate electrode layer; forming an oxide semiconductor layer over the gate insulating layer; forming a source electrode layer and a drain electrode layer over the oxide semiconductor layer; forming an insulating layer over the oxide semiconductor layer, the source electrode layer, and the drain electrode layer; forming an insulating layer including hydrogen over the insulating layer; and after forming the insulating layer including hydrogen, performing heat treatment so that hydrogen in the insulating layer including hydrogen is supplied to at least the oxide semiconductor layer.

Another embodiment of the present invention is a manufacturing method of a semiconductor device including a step of, after forming the insulating layer, forming a back gate electrode over the insulating layer and in a region overlapping with the gate electrode layer.

Another embodiment of the present invention is a manufacturing method of a semiconductor device, including the steps of forming a gate electrode layer over a substrate having an insulating surface; forming a gate insulating layer over the gate electrode layer; forming an oxide semiconductor layer over the gate insulating layer; forming an insulating layer functioning as a channel protective layer over part of the oxide semiconductor layer; forming a source electrode layer and a drain electrode layer over the oxide semiconductor layer and the insulating layer; forming an insulating layer including hydrogen over the insulating layer, the source electrode layer, and the drain electrode layer; and after forming the insulating layer including hydrogen, performing heat treatment so that hydrogen in the insulating layer including hydrogen is supplied to at least the oxide semiconductor layer.

Another embodiment of the present invention is a manufacturing method of a semiconductor device, including the steps of forming an oxide semiconductor layer over a substrate having an insulating surface; forming a source electrode layer and a drain electrode layer over the oxide semiconductor layer; forming an insulating layer functioning as a gate insulating layer over the oxide semiconductor layer, the source electrode layer, and the drain electrode layer; forming a gate electrode layer over the insulating layer; forming an insulating layer including hydrogen over the insulating layer and the gate electrode layer; and after forming the insulating layer including hydrogen, performing heat treatment so that hydrogen in the insulating layer including hydrogen is supplied to at least the oxide semiconductor layer.

Further, a feature of an embodiment of the present invention is, in a transistor using an oxide semiconductor layer for a channel formation region, that characteristics of the transistor are improved by the steps of, after reducing the hydrogen concentration of the oxide semiconductor layer, forming an insulating layer including oxygen in contact with the oxide semiconductor layer; after performing heat treatment to oxidize an oxygen vacancy portion in the oxide semiconductor layer so that an i-type (intrinsic) or substantially i-type oxide semiconductor layer is formed, forming an insulating layer including hydrogen over the insulating layer including oxygen; and supplying hydrogen in the insulating layer including hydrogen to at least one of an interface between a gate insulating layer and the oxide semiconductor layer, the oxide semiconductor layer, and an interface between the oxide semiconductor layer and the insulating layer including oxygen. Note that in this specification, "i-type semiconductor" means a semiconductor having a carrier density lower than $1\times10^{12}$ cm$^{-3}$, preferably lower than $1.45\times10^{10}$ cm$^{-3}$.

Another embodiment of the present invention is a manufacturing method of a semiconductor device, including the steps of forming a gate electrode layer over a substrate having an insulating surface; forming a gate insulating layer over the gate electrode layer; forming an oxide semiconductor layer over the gate insulating layer; after forming the oxide semiconductor layer, performing first heat treatment so that a hydrogen concentration of the oxide semiconductor layer is reduced; forming a source electrode layer and a drain electrode layer over the oxide semiconductor layer; forming an insulating layer including oxygen over the oxide semiconductor layer, the source electrode layer, and the drain electrode layer; after forming the insulating layer including oxygen, performing second heat treatment so that oxygen is supplied to the oxide semiconductor layer; forming an insulating layer including hydrogen over the insulating layer including oxygen; and after forming the insulating layer including hydrogen, performing third heat treatment so that hydrogen in the insulating layer including hydrogen is supplied to at least the oxide semiconductor layer.

Another embodiment of the present invention is a manufacturing method of a semiconductor device including a step of, after forming the insulating layer including oxygen, forming a back gate electrode over the insulating layer including oxygen and in a region overlapping with the gate electrode layer.

Another embodiment of the present invention is a manufacturing method of a semiconductor device, including the steps of forming a gate electrode layer over a substrate having an insulating surface; forming a gate insulating layer over the gate electrode layer; forming an oxide semiconductor layer over the gate insulating layer; after forming the oxide semiconductor layer, performing first heat treatment so that a hydrogen concentration of the oxide semiconductor layer is reduced; forming an insulating layer including oxygen functioning as a channel protective layer over part of the oxide semiconductor layer; after forming the insulating layer including oxygen, performing second heat treatment so that oxygen is supplied to the oxide semiconductor layer; forming a source electrode layer and a drain electrode layer over the oxide semiconductor layer and the insulating layer including oxygen; forming an insulating layer including hydrogen over the insulating layer including oxygen, the source electrode layer, and the drain electrode layer; and after forming the insulating layer including hydrogen, performing third heat treatment so that hydrogen in the insulating layer including hydrogen is supplied to at least the oxide semiconductor layer.

Another embodiment of the present invention is a manufacturing method of a semiconductor device, including the steps of forming an oxide semiconductor layer over a substrate having an insulating surface; after forming the oxide semiconductor layer, performing first heat treatment so that a hydrogen concentration of the oxide semiconductor layer is reduced; forming a source electrode layer and a drain electrode layer over the oxide semiconductor layer; forming an insulating layer including oxygen functioning as a gate insulating layer over the oxide semiconductor layer, the source electrode layer, and the drain electrode layer; after forming the insulating layer including oxygen, performing second heat treatment so that oxygen is supplied to the oxide semiconductor layer; forming a gate electrode layer over the insulating layer including oxygen; forming an insulating layer including hydrogen over the insulating layer including oxygen and the gate electrode layer; and after forming the insulating layer including hydrogen, performing third heat treatment so that hydrogen in the insulating layer including hydrogen is supplied to at least the oxide semiconductor layer.

Heat treatment at a temperature higher than or equal to 150° C. and lower than or equal to 450° C., preferably higher than or equal to 250° C. and lower than or equal to 440° C. performed after formation of the insulating layer including hydrogen over the insulating layer including oxygen in contact with the oxide semiconductor layer enables supply of hydrogen in the insulating layer including hydrogen to at least one of the interface between the gate insulating layer and the oxide semiconductor layer, the oxide semiconductor layer, and the interface between the oxide semiconductor layer and the insulating layer including oxygen. Further, with the supplied hydrogen, a defect or a dangling bond included in the oxide semiconductor layer can be terminated. As a result, on-state current and field-effect mobility of the transistor can be increased.

Heat treatment in a furnace or a rapid thermal annealing method (an RTA method) is used as the heat treatment. As the RTA method, a method using a lamp light source or a method in which heat treatment is performed in a short time while a substrate is moved in a heated gas can be employed. With the use of the RTA method, it is also possible to make the time needed for heat treatment shorter than 0.1 hours.

The insulating layer including oxygen is preferably a silicon oxide layer or a silicon oxynitride layer formed by a sputtering method or a CVD method, and it is particularly preferable to use a silicon oxide layer formed by a sputtering method.

The insulating layer including hydrogen is preferably a silicon nitride layer, a silicon nitride oxide layer, an aluminum nitride layer, or an aluminum nitride oxide layer formed by a sputtering method or a CVD method. In particular, a silicon nitride layer or a silicon nitride oxide layer formed by a CVD method using at least silane and a gas including nitrogen (typically, a nitrogen gas, an ammonia gas, or the like) as a source gas is preferably used. In addition, an aluminum nitride layer or an aluminum nitride oxide layer formed by a CVD method using at least aluminum hydride and a gas including nitrogen as a source gas is preferable because they include a comparatively large number of hydrogen atoms. Note that the insulating layer including hydrogen refers to an insulating layer that includes many hydrogen atoms as compared to the insulating layer in contact with the oxide semiconductor layer. For example, the hydrogen concentration of the insulating layer including hydrogen is higher than or equal to $1\times10^{21}$ atoms/cm$^3$, preferably higher than or equal to $1\times10^{22}$ atoms/cm$^3$, and further preferably higher than or equal to $1\times10^{23}$ atoms/cm$^3$.

The oxide semiconductor layer is a metal oxide, and can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; or an In—O-based material, a Sn—O-based material, a Zn—O-based material, or the like.

For the oxide semiconductor layer, a material represented by InMO$_3$(ZnO)$_m$ (m>0) can be used. Here, M represents one or more metal elements selected from Ga, Al, Mn, and Co. For example, M can be Ga, Ga and Al, Ga and Mn, Ga and Co, or the like.

For the oxide semiconductor layer, an oxide semiconductor material represented by In-M$_x$-Zn$_Y$—O$_Z$ (Y=0.5 to 5) may be used. Here, M represents one or more elements selected from elements of Group 13 such as gallium (Ga), aluminum (Al), and boron (B). Note that the contents of In, M, Zn, and O can be set freely, and the case where the M content is zero (that is, x=0) is included. The contents of In and Zn are not zero. In other words, the above-described expression includes In—Ga—Zn—O, In—Zn—O, and the like.

The oxide semiconductor layer can have an amorphous structure or a structure in which a crystalline region is included in an amorphous region. When the oxide semiconductor layer has an amorphous structure, characteristic variation among a plurality of elements can be reduced. Further, when the oxide semiconductor layer has a structure in which a crystalline region is included in an amorphous region, a transistor having high field-effect mobility and large on-state current can be obtained.

On a transistor using an oxide semiconductor layer for a channel formation region, first heat treatment is performed in an atmosphere which includes little hydrogen and moisture (a nitrogen atmosphere, an oxygen atmosphere, a dry-air atmosphere (e.g., as for moisture, the dew point is −40° C. or lower, preferably −50° C. or lower), or the like) at a temperature higher than or equal to 400° C. and lower than or equal to 750° C., preferably higher than or equal to 400° C. and lower than the strain point of the substrate, so that the hydrogen concentration of the oxide semiconductor layer is reduced. Next, an insulating layer including oxygen in contact with the oxide semiconductor layer is formed, and then second heat treatment is performed in an inert gas atmosphere or an oxygen gas atmosphere (preferably at a temperature higher than or equal to 200° C. and lower than or equal to 450° C., and for example at a temperature higher than or equal to 250° C. and lower than or equal to 350° C.), so that oxygen is supplied to an oxygen vacancy of the oxide semiconductor layer. Thus, an i-type (intrinsic) or substantially i-type semiconductor layer is formed. Next, an insulating layer including hydrogen is formed over the insulating layer including oxygen. Then, third heat treatment is performed at a temperature higher than or equal to 150° C. and lower than or equal to 450° C., preferably higher than or equal to 250° C. and lower than or equal to 440° C., whereby hydrogen in the insulating layer including hydrogen is supplied to at least one of the interface between the gate insulating layer and the oxide semiconductor layer, the oxide semiconductor layer, and the interface between the oxide semiconductor layer and the insulating layer including oxygen. The hydrogen terminates a defect or a dangling bond included in the oxide semiconductor layer. In this manner, transistor characteristics can be improved.

In the first heat treatment, an impurity such as moisture or hydrogen included in the oxide semiconductor layer is reduced, so that the oxide semiconductor layer can be purified to become an i-type (intrinsic) or substantially i-type semiconductor layer. The hydrogen concentration of the i-type (intrinsic) or substantially i-type oxide semiconductor layer is $1\times10^{18}$ cm$^{-3}$ or lower, preferably $1\times10^{16}$ cm$^{-3}$ or lower, and further preferably substantially 0 according to the measurement using secondary ion mass spectroscopy (SIMS). In addition, the carrier density of the i-type (intrinsic) or substantially i-type oxide semiconductor is lower than $1\times10^{12}$ cm$^{-3}$, preferably lower than $1.45\times10^{10}$ cm$^{-3}$ according to the Hall effect measurement or capacitance-voltage measurement (CV measurement). That is, the carrier density of the oxide semiconductor layer is nearly zero. Further, the band gap of the i-type (intrinsic) or substantially i-type oxide semiconductor is 2 eV or larger, preferably 2.5 eV or larger, and further preferably 3 eV or larger.

Specifically, for example, even when a transistor which uses the oxide semiconductor layer purified in the above-described manner for a channel formation region has a channel width W of $1\times10^4$ μm and a channel length of 3 μm, it has an off-state current of $10^{-13}$ A or less and a subthreshold swing (S value) of approximately 0.1 V/dec. (the thickness of a gate insulating layer is 100 nm). Thus, off-state current in the state where voltage between a gate electrode layer and a source electrode layer is approximately 0, that is, leakage current of the transistor is much smaller than that of a transistor including silicon having crystallinity. Note that in this specification, off-state current refers to, in the case of an n-channel transistor for example, a current between the source and the drain when the gate-source voltage is −5 V.

Another embodiment of the present invention is a semiconductor device including a gate electrode layer over a substrate having an insulating surface; a gate insulating layer over the gate electrode layer; an oxide semiconductor layer over the gate insulating layer; a source electrode layer and a drain electrode layer over the oxide semiconductor layer; an insulating layer including oxygen in contact with the oxide semiconductor layer; and an insulating layer including hydrogen in contact with the insulating layer including oxygen.

The transistor may be a bottom-gate transistor, a top-gate transistor, or a bottom-contact transistor. The bottom-gate transistor includes a gate electrode layer over a substrate, a gate insulating layer over the gate electrode layer, an oxide semiconductor layer which overlaps with the gate electrode layer over the gate insulating layer, and a source electrode layer and a drain electrode layer over the oxide semiconductor layer.

The top-gate transistor includes an oxide semiconductor layer over a substrate, a gate insulating layer over the oxide semiconductor layer, a gate electrode layer which overlaps with the oxide semiconductor layer over the gate insulating layer, and a source electrode layer and a drain electrode layer.

The bottom-contact transistor includes a gate electrode layer over a substrate, a gate insulating layer over the gate electrode layer, a source electrode layer and a drain electrode layer over the gate insulating layer, and an oxide semiconductor layer which is over the source electrode layer and the drain electrode layer and overlaps with the gate electrode layer with the gate insulating layer positioned therebetween.

On-state current and field-effect mobility of the transistor can be improved. Further, off-state current is reduced and on-state current is increased, so that on/off ratio of the transistor can be increased. With the use of such a transistor, a large-sized display device, a high-performance semiconductor device, and the like can be realized.

BEST MODE FOR CARRYING OUT THE INVENTION

Hereinafter, embodiments of the present invention will be described in detail with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description in the embodiments below.

The present invention can be applied to manufacture any kind of semiconductor devices including microprocessors, integrated circuits such as image processing circuits, RF tags, and semiconductor display devices. A semiconductor device means any device which can function by utilizing semiconductor characteristics, and a semiconductor display device, a semiconductor circuit, and an electronic device are all included in the category of the semiconductor device. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element including a semiconductor element is included in a driver circuit.

Embodiment 1

In this embodiment, a structure of a transistor included in a semiconductor device, which is an embodiment of the present invention, will be described. As the transistor, an inverted staggered transistor will be described in this embodiment.

Figure 1:
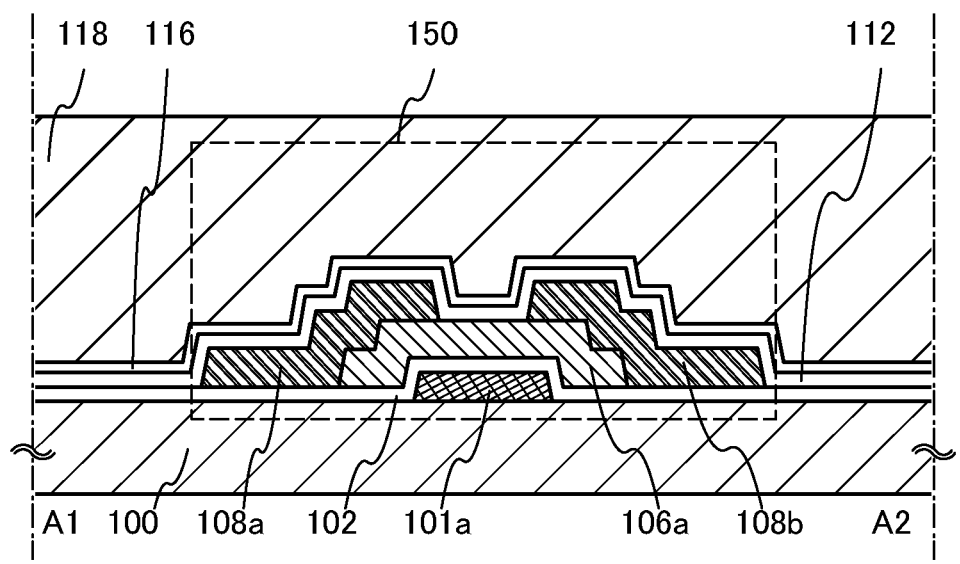
FIG. 1 is a cross-sectional view illustrating an embodiment of the present invention.

In a transistor 150 illustrated in FIG. 1, a gate electrode layer 101a is formed over a substrate 100, and a gate insulating layer 102 is formed over the gate electrode layer 101a. An oxide semiconductor layer 106a, as a channel formation region, is formed over the gate insulating layer 102, and a source or drain electrode layer 108a and a source or drain electrode layer 108b are formed over the oxide semiconductor layer 106a. An insulating layer 112 including oxygen is formed over the source or drain electrode layer 108a, the source or drain electrode layer 108b, and the oxide semiconductor layer 106a. The insulating layer 112 including oxygen is in contact with a back channel of the oxide semiconductor layer 106a. An insulating layer 116 including hydrogen is formed in contact with the insulating layer 112 including oxygen. An interlayer insulating layer 118 functioning as a planarization film may be formed over the insulating layer 116 including hydrogen. The transistor 150 described in this embodiment has a feature of including the insulating layer 112 including oxygen in contact with the oxide semiconductor layer 106a and the insulating layer 116 including hydrogen in contact with the insulating layer 112 including oxygen.

The substrate 100 needs to have at least heat resistance high enough to withstand heat treatment to be performed later. For example, a glass substrate manufactured by a fusion process or a float process can be used as the substrate 100. In the case where a glass substrate is used and the temperature of the heat treatment to be performed later is high, a glass substrate whose strain point is higher than or equal to 730° C. is preferably used. As the glass substrate, a substrate of a glass material such as aluminosilicate glass, aluminoborosilicate glass, or barium borosilicate glass is used, for example. Note that by containing a larger amount of barium oxide (BaO) than boron oxide, a glass substrate that is heat-resistant and of more practical use can be obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used. Further alternatively, a metal substrate such as a stainless-steel alloy substrate, having a surface provided with an insulating layer, may also be applied.

Further, a substrate formed from a flexible synthetic resin, such as plastic, generally tends to have a low upper temperature limit, but can be used as the substrate 100 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

The gate electrode layer 101a can be formed to have a single-layer structure or a stacked structure using a metal material such as molybdenum, titanium, chromium, tantalum, tungsten, neodymium, or scandium; a conductive layer of an alloy material which contains any of these metal materials as its main component; or a nitride which contains any of these metals. Note that aluminum or copper can also be used as such a metal material if it can withstand the temperature of heat treatment to be performed in a later process. Aluminum or copper is preferably used in combination with a refractory metal material so as to prevent problems of heat resistance and corrosion. As the refractory metal material, molybdenum, titanium, chromium, tantalum, tungsten, neodymium, scandium, or the like can be used.

For example, for the gate electrode layer 101a having a two-layer structure, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferably used. For the gate electrode layer 101a having a three-layer structure, a stacked structure including an aluminum layer, an alloy layer of aluminum and silicon, an alloy layer of aluminum and titanium, or an alloy layer of aluminum and neodymium as a middle layer and also including any of a tungsten layer, a tungsten nitride layer, a titanium nitride layer, and a titanium layer as a top layer and a bottom layer, is preferably used.

Further, a light-transmitting oxide conductive layer of indium oxide, an alloy of indium oxide and tin oxide, an alloy of indium oxide and zinc oxide, zinc oxide, zinc aluminum oxide, zinc aluminum oxynitride, zinc gallium oxide, or the like may be used as the gate electrode layer 101a, whereby the aperture ratio of a pixel portion in a display device can be increased. The thickness of the gate electrode layer 101a is 10 nm to 400 nm, preferably 100 nm to 200 nm.

The gate insulating layer 102 can be formed to have a single-layer structure or a stacked structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a tantalum oxide layer. The thickness of the gate insulating layer 102 is not particularly limited but, for example, can be larger than or equal to 10 nm and less than or equal to 500 nm.

Alternatively, the gate insulating layer 102 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby gate leakage can be reduced. Further alternatively, a stacked structure in which a high-k material and one or more of a silicon oxide layer, a silicon nitride layer, a silicon oxynitride layer, a silicon nitride oxide layer, and an aluminum oxide layer are stacked can be used.

It is preferable to use a dense and high-quality insulating layer having high withstand voltage, which is formed by a high-density plasma CVD method with the use of microwaves (2.45 GHz), as the gate insulating layer 102 because the interface state between the oxide semiconductor layer 106a and the gate insulating layer 102 can be reduced and favorable interface properties can be obtained.

The gate insulating layer 102 may have a structure in which an insulating layer formed using a material having a high barrier property and an insulating layer having a low content of nitrogen such as a silicon oxide layer or a silicon oxynitride layer are stacked. In this case, the insulating layer such as a silicon oxide layer or a silicon oxynitride layer is formed between the insulating layer having a barrier property and the oxide semiconductor layer. As the insulating layer having a high barrier property, for example, a silicon nitride layer, a silicon nitride oxide layer, an aluminum nitride layer, an aluminum nitride oxide layer, or the like can be given, for example. When the insulating layer having a barrier property is used, impurities in an atmosphere, such as moisture or hydrogen, or impurities included in the substrate, such as an alkali metal or a heavy metal, can be prevented from entering the gate insulating layer 102, the oxide semiconductor layer 106a, the interface between the oxide semiconductor layer 106a and another insulating layer, or the vicinity thereof. In addition, when the insulating layer having a low content of nitrogen such as a silicon oxide layer or a silicon oxynitride layer is formed in contact with the oxide semiconductor layer 106a, the insulating layer formed using a material having a high barrier property can be prevented from being directly in contact with the oxide semiconductor layer.

The oxide semiconductor layer 106a is a metal oxide, and can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; or an In—O-based material, a Sn—O-based material, a Zn—O-based material, or the like.

For the oxide semiconductor layer 106a, a material represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

For the oxide semiconductor layer 106a, an oxide semiconductor material represented by $In-M_x-Zn_y-O_z$ (Y=0.5 to 5) may be used. Here, M represents one or more elements selected from elements of Group 13 such as gallium (Ga), aluminum (Al), and boron (B). Note that the contents of In, m, Zn, and O can be set freely, and the case where the M content is zero (that is, x=0) is included. The contents of In and Zn are not zero. In other words, the above-described expression includes In—Ga—Zn—O, In—Zn—O, and the like.

The oxide semiconductor layer 106a can have an amorphous structure containing no crystalline component or a structure in which a crystalline region is included in an amorphous region. Typically, the structure in which a crystalline region is included in an amorphous region includes a crystalline region having a crystal grain size greater than or equal to 1 nm and less than or equal to 20 nm (typically, greater than or equal to 2 nm and less than or equal to 4 nm) in an amorphous region. When the oxide semiconductor layer 106a has an amorphous structure, characteristic variation among a plurality of elements can be reduced.

The source or drain electrode layer 108a and the source or drain electrode layer 108b are formed using a metal element selected from aluminum, chromium, copper, tantalum, titanium, molybdenum, tungsten, and yttrium; an alloy containing any of these metal elements as a component; an alloy containing these metal elements in combination; or the like. Alternatively, one or more metal elements selected from manganese, magnesium, zirconium, and beryllium can be used. The source or drain electrode layer 108a and the source or drain electrode layer 108b can have a single-layer structure or a stacked structure of two or more layers. For example, the source or drain electrode layer 108a and the source or drain electrode layer 108b can have a single-layer structure of an aluminum layer containing silicon; a two-layer structure in which a titanium layer is stacked over an aluminum layer; a two-layer structure in which a titanium layer is stacked over a tungsten layer; or a three-layer structure in which a titanium layer, an aluminum layer, and a titanium layer are stacked in this order. Alternatively, a layer which contains aluminum and one or more elements selected from titanium, tantalum, tungsten, molybdenum, chromium, neodymium, and scandium may be used. An alloy layer or a nitride layer of such a layer may be used.

The source or drain electrode layer 108a and the source or drain electrode layer 108b can be formed using a light-transmitting conductive layer such as an indium tin oxide layer, an indium oxide layer containing tungsten oxide, an indium zinc oxide layer containing tungsten oxide, an indium oxide layer containing titanium oxide, an indium tin oxide layer containing titanium oxide, an indium zinc oxide layer, or an indium tin oxide layer to which silicon oxide is added. It is also possible to employ a stacked structure of the above-described light-transmitting conductive layer and the above-described metal element.

The insulating layer 112 including oxygen is formed using an insulating layer including oxygen, such as a silicon oxide layer or a silicon oxynitride layer. It is preferable to form the insulating layer 112 including oxygen by a sputtering method or a CVD method, and is particularly preferable to form a silicon oxide layer by a sputtering method as the insulating layer 112 including oxygen.

The insulating layer 116 including hydrogen is formed using an insulating layer including hydrogen, such as a silicon nitride layer, a silicon nitride oxide layer, an aluminum nitride layer, an aluminum nitride oxide layer, or the like. For example, the hydrogen concentration of the insulating layer 116 including hydrogen is higher than or equal to $1 \times 10^{21}$ atoms/cm$^3$, preferably higher than or equal to $1 \times 10^{22}$ atoms/cm$^3$, and further preferably higher than or equal to $1 \times 10^{23}$ atoms/cm$^3$. The insulating layer 116 including hydrogen is preferably formed by a sputtering method or a CVD method. In particular, a silicon nitride layer or a silicon nitride oxide layer formed by a CVD method using at least silane and a gas including nitrogen (typically, a nitrogen gas, an ammonia gas, or the like) as a source gas, or an aluminum nitride layer or an aluminum nitride oxide layer formed by a CVD method using at least aluminum hydride and a gas including nitrogen (typically, a nitrogen gas, an ammonia gas, or the like) as a source gas is preferable because they include a comparatively large number of hydrogen atoms.

By heat treatment at a temperature higher than or equal to 150° C. and lower than or equal to 450° C., preferably higher than or equal to 250° C. and lower than or equal to 440° C., hydrogen in the insulating layer 116 including hydrogen is diffused into or supplied to at least the oxide semiconductor layer 106a and terminates a defect or a dangling bond included in at least one of the oxide semiconductor layer 106a, an interface between the gate insulating layer 102 and the oxide semiconductor layer 106a, and the interface between the oxide semiconductor layer 106a and the insulating layer 112 including oxygen. Thus, defects in the oxide semiconductor layer 106a are reduced. As a result, on-state current and field-effect mobility of the transistor are increased.

Using this embodiment, a transistor having high field-effect mobility and large on-state current can be realized. Further, a transistor having small off-state current, high field-effect mobility, and large on-state current can be realized.

Embodiment 2

Next, a manufacturing method of the transistor 150, which is an example of the structure of a semiconductor device, will be described with reference to FIGS. 2A to 2C, FIGS. 3A to 3C, and FIGS. 4A to 4C.

Figure 2A:
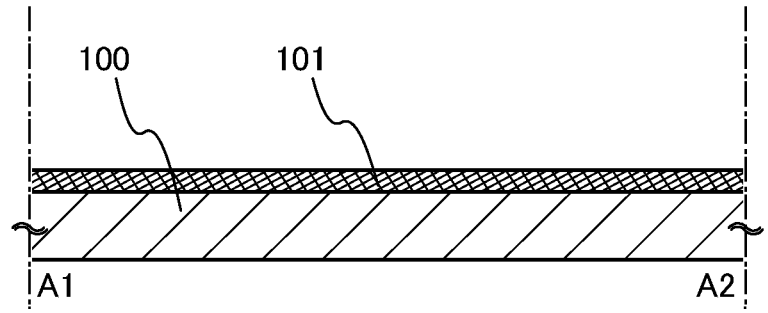
FIGS. 2A to 2C are cross-sectional process views illustrating an embodiment of the present invention.

First, a conductive layer 101 is formed over a substrate 100 (see FIG. 2A).

Any substrate can be used for the substrate 100 as long as it is a substrate having an insulating surface, and a glass substrate can be used, for example. Further, it is preferable that the glass substrate be a non-alkali glass substrate. As a material of the non-alkali glass substrate, a glass material such as aluminosilicate glass, aluminoborosilicate glass, barium borosilicate glass, or the like is used, for example. Alternatively, as the substrate 100, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used.

Further, a substrate formed from a flexible synthetic resin, such as plastic, generally tends to have a low upper temperature limit, but can be used as the substrate 100 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

The conductive layer 101 can be formed using a PVD method such as a sputtering method, or a CVD method such as a plasma CVD method. The conductive layer 101 can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more of elements selected from titanium, tantalum, tungsten, molybdenum, chromium, neodymium, and scandium may be used.

The conductive layer 101 may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 101 may have a single-layer structure or a stacked structure of two or more layers. In an embodiment of the disclosed invention, since heat treatment at a relatively high temperature is performed after formation of the conductive layer 101, the conductive layer 101 is preferably formed using a material having high heat resistance. As the material having high heat resistance, titanium, tantalum, tungsten, molybdenum, and the like can be given, for example. Polysilicon whose conductivity is increased by addition of an impurity element, or the like can also be used.

Figure 2B:
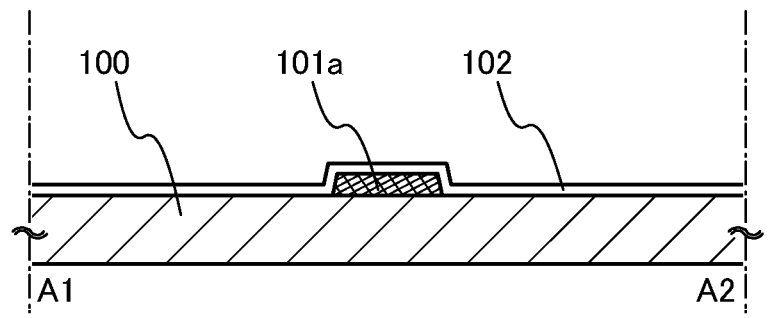

Next, the conductive layer 101 is selectively etched to form a gate electrode layer 101a, and a gate insulating layer 102 covering the gate electrode layer 101a is formed (see FIG. 2B).

For light exposure for forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light whose wavelength is several nanometers to several tens of nanometers, which is extremely short. Light exposure using extreme ultraviolet light has a feature of high resolution and large depth of focus and, therefore, is appropriate for miniaturization.

The gate insulating layer 102 can be formed using a CVD method, a sputtering method, or the like. The gate insulating layer 102 is preferably formed so as to include silicon oxide, silicon nitride, silicon oxynitride, silicon nitride oxide, aluminum oxide, hafnium oxide, tantalum oxide, or the like. The gate insulating layer 102 may have either a single-layer structure or a stacked structure. The thickness of the gate insulating layer 102 is not particularly limited but, for example, can be larger than or equal to 10 nm and less than or equal to 500 nm.

Alternatively, the gate insulating layer 102 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby gate leakage can be reduced. Further alternatively, a stacked structure in which a high-k material and one or more of a silicon oxide layer, a silicon nitride layer, a silicon oxynitride layer, a silicon nitride oxide layer, and an aluminum oxide layer are stacked can be used.

The gate insulating layer 102 is preferably formed so as to include as few hydrogen or water as possible.

In the case of using a sputtering method or the like, for example, it is preferable that the gate insulating layer 102 be formed in a state where moisture remaining in the treatment chamber is removed. In order to remove moisture remaining in the treatment chamber, an entrapment vacuum pump such as a cryopump, an ion pump, or a titanium sublimation pump is preferably used. A turbo pump provided with a cold trap may be used in order to remove moisture remaining in the treatment chamber. From the treatment chamber evacuated with a cryopump or the like, hydrogen, water, or the like is sufficiently removed; thus, the concentration of an impurity in the gate insulating layer 102 can be reduced.

A high-density plasma CVD method using a microwave (e.g., 2.45 GHz) is favorable because the high-quality gate insulating layer 102 which is dense and has high withstand voltage can be formed. A close contact between an oxide semiconductor layer and a high-quality gate insulating layer reduces interface states and produces desirable interface characteristics. It is particularly preferable to use a high-density plasma apparatus which can realize a plasma density higher than or equal to $1\times10^{11}/cm^3$.

By thus improving characteristics of the interface between the gate insulating layer 102 and an oxide semiconductor layer 106a and eliminating an impurity, particularly hydrogen, water, or the like, from the oxide semiconductor, it is possible to obtain a stable transistor whose threshold voltage ($V_{th}$) does not vary in a gate bias-temperature stress test (BT test: e.g., at 85° C. and $2\times10^6$ V/cm for 12 hours).

When the gate insulating layer 102 is formed, it is desirable to use a high-purity gas in which an impurity such as hydrogen or water is reduced so that the concentration thereof is decreased to approximately a value expressed in the unit "ppm" (preferably, "ppb").

Figure 2C:
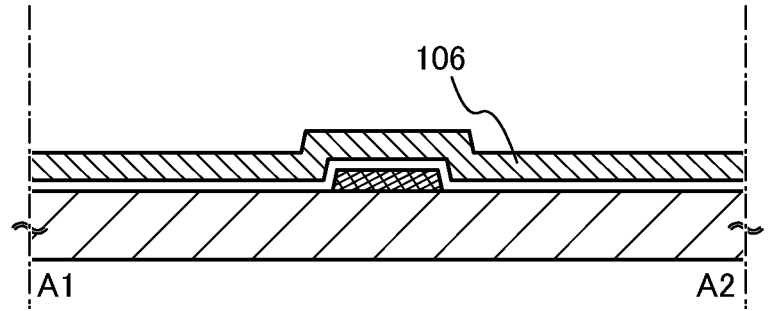

Next, an oxide semiconductor layer 106 is formed over the gate insulating layer 102 (see FIG. 2C).

The oxide semiconductor layer 106 can be formed using an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, or an In—Mg—O-based material which are two-component metal oxides; or an In—O-based material, a Sn—O-based material, a Zn—O-based material, or the like which are one-component metal oxides.

In particular, an In—Ga—Zn—O-based oxide semiconductor material has sufficiently high resistance when there is no electric field and thus off-state current can be sufficiently small. In addition, having a high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material expressed by $InMO_3(ZnO)_m$ (m>0). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

In this embodiment, as the oxide semiconductor layer 106, an amorphous oxide semiconductor layer is formed by a sputtering method using a target for depositing an In—Ga—Zn—O-based oxide semiconductor.

As the target for depositing an oxide semiconductor used for forming the In—Ga—Zn—O-based oxide semiconductor layer 106 by a sputtering method, a target having the following composition ratio may be used: In:Ga:Zn=1:x:y (x is greater than or equal to 0, and y is greater than or equal to 0.5 and less than or equal to 5). For example, a target for depositing an oxide semiconductor, which has such a composition ratio that In:Ga:Zn=1:1:1 [atomic ratio] (x=1, y=1) (that is, $In_2O_3:Ga_2O_3:ZnO=1:1:2$ [molar ratio]), or the like may be used. As the target for depositing an oxide semiconductor, a target for depositing an oxide semiconductor, which has such a composition ratio that In:Ga:Zn=1:1:0.5 [atomic ratio], a target for depositing an oxide semiconductor, which has such a composition ratio that In:Ga:Zn=1:1:2 [atomic ratio], or a target for depositing an oxide semiconductor, which has such a composition ratio that In:Ga:Zn=1:0:1 [atomic ratio] (x=0, y=1) can be used.

In addition, an oxide semiconductor contained in the target for depositing an oxide semiconductor has a relative density of 80% or more, preferably 95% or more, and further preferably 99.9% or more. With a target for depositing an oxide semiconductor having a high relative density, the oxide semiconductor layer 106 can be formed dense.

The atmosphere in which the oxide semiconductor layer 106 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which an impurity such as hydrogen, water, a hydroxyl group, or hydride is removed so that the concentration thereof is decreased to approximately a value expressed in the unit "ppm" (preferably, "ppb").

At the time of forming the oxide semiconductor layer 106, for example, the substrate is held in a treatment chamber that is maintained at reduced pressure and the substrate temperature is set to a temperature higher than or equal to 100° C. and lower than or equal to 600° C., preferably higher than or equal to 200° C. and lower than or equal to 400° C. Then, a sputtering gas from which hydrogen and water are removed is introduced into the treatment chamber while moisture remaining in the treatment chamber is removed, and the above-described target for depositing an oxide semiconductor is used; thus, the oxide semiconductor layer 106 is formed. When the oxide semiconductor layer 106 is formed while the substrate is heated, impurities contained in the oxide semiconductor layer 106 can be reduced. In addition, damage by sputtering can be reduced. In order to remove moisture remaining in the treatment chamber, an entrapment vacuum pump is preferably used. For example, a cryopump, an ion pump, a titanium sublimation pump, or the like can be used. A turbo pump provided with a cold trap may be used. Since hydrogen, water, or the like is removed from the treatment chamber which is evacuated with the cryopump, the concentration of impurities in the oxide semiconductor layer 106 can be reduced.

For example, the deposition conditions of the oxide semiconductor layer 106 are as follows: the distance between the substrate and the target for depositing an oxide semiconductor is 170 mm, the pressure is 0.4 Pa, the direct-current (DC) power is 0.5 kW, and the atmosphere is an oxygen atmosphere (the proportion of oxygen is 100%), an argon atmosphere (the proportion of argon is 100%), or a mixed atmosphere of oxygen and argon. Note that the use of a pulse direct-current (DC) power supply is preferable because powder substances (also referred to as particles or dust) generated at the time of deposition can be reduced and the film thickness can be made uniform. The thickness of the oxide semiconductor layer 106 is greater than or equal to 2 nm and less than or equal to 200 nm, and preferably greater than or equal to 5 nm and less than or equal to 30 nm. Note that the appropriate thickness varies depending on the material of the oxide semiconductor, the usage, or the like, and thus the thickness of the oxide semiconductor layer 106 may be determined as appropriate depending on the material, the usage, or the like.

Note that before the oxide semiconductor layer 106 is formed by a sputtering method, reverse sputtering in which plasma is generated with an argon gas introduced is preferably performed so that a material attached to the surface of the gate insulating layer 102 is removed. Here, the reverse sputtering is a method in which ions collide with a processing surface so that the surface is modified, in contrast to normal sputtering in which ions collide with a sputtering target. An example of the method for making ions collide with a processing surface is a method in which high-frequency voltage is applied to the processing surface side in an argon atmosphere so that plasma is generated in the vicinity of a substrate. Note that an atmosphere of nitrogen, helium, oxygen, or the like may be used instead of an argon atmosphere.

Figure 3A:
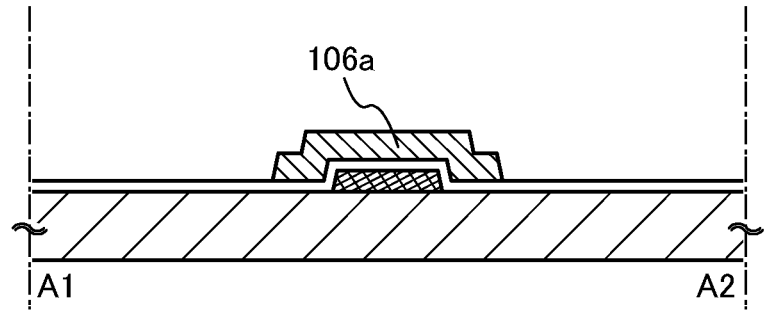
FIGS. 3A to 3C are cross-sectional process views illustrating an embodiment of the present invention.

Next, the oxide semiconductor layer 106 is processed into an island-shaped oxide semiconductor layer 106a by using a method such as etching using a mask (see FIG. 3A). Here, the island-shaped oxide semiconductor layer 106a is formed in a region overlapping with the gate electrode layer 101a.

As a method for etching the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

As the dry etching method, a parallel-plate reactive ion etching (RIE) method, an inductively coupled plasma (ICP) etching method, or the like can be used. Also in this case, etching conditions (e.g., the amount of electric power applied to a coiled electrode, the amount of electric power applied to an electrode on the substrate side, and the electrode temperature on the substrate side) need to be set as appropriate.

An example of an etching gas which can be used for dry etching is a gas containing chlorine (a chlorine-based gas such as chlorine ($Cl_2$), boron chloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

An example of an etchant which can be used for wet etching includes a mixed solution of phosphoric acid, acetic acid, and nitric acid, or the like. An etchant such as ITO07N (produced by KANTO CHEMICAL CO., INC.) may also be used.

After that, heat treatment (first heat treatment) is preferably performed on the oxide semiconductor layer 106a. Excessive hydrogen (including water and a hydroxyl group) in the oxide semiconductor layer 106a can be removed by this first heat treatment, whereby the structure of the oxide semiconductor layer can be ordered and defects in the oxide semiconductor layer 106a can be reduced. The temperature of the first heat treatment is, for example, higher than or equal to 400° C. and lower than or equal to 750° C., or higher than or equal to 400° C. and lower than or equal to the strain point of the substrate. Note that in the case where the amount of hydrogen contained in the oxide semiconductor layer 106a is sufficiently small right after the deposition, the heat treatment is not needed.

The heat treatment can be performed in such a way that, for example, the substrate 100 is introduced into an electric furnace in which a resistance heating element or the like is used and heated at 450° C. under a nitrogen atmosphere for an hour. During the heat treatment, the oxide semiconductor layer 106a is not exposed to the air, in order to prevent entry of water and hydrogen.

The heat treatment apparatus is not limited to an electric furnace; the heat treatment apparatus can be an apparatus that heats an object using thermal conduction or thermal radiation from a medium such as a heated gas or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, a GRTA process may be performed in the following manner. The substrate is put in an inert gas atmosphere which has been heated to a high temperature of 650° C. to 700° C., heated for several minutes, and taken out of the inert gas atmosphere. The GRTA process enables a high-temperature heat treatment in a short time. Moreover, the GRTA process can be employed even when the temperature exceeds the upper temperature limit of the substrate because the heat treatment takes only a short time. In the case where a glass substrate is used, shrinkage of the substrate becomes a problem at a temperature higher than the upper temperature limit (strain point) but does not in the case of performing heat treatment in a short time. Note that the gas may be switched from the inert gas to a gas including oxygen during the process. This is because defects caused by an oxygen vacancy can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6 N (99.9999%) or more, preferably 7 N (99.99999%) or more (i.e., the impurity concentration is 1 ppm or less, preferably 0.1 ppm or less).

Through the above-described first heat treatment, hydrogen included in the oxide semiconductor layer 106 is reduced or preferably removed, so that the oxide semiconductor layer 106 is purified so as to include as few impurities other than main components of the oxide semiconductor layer as possible. Thus, the structure of the oxide semiconductor layer 106 which has been disordered due to excessive hydrogen atoms can be ordered and defects caused by the excessive hydrogen atoms can be reduced. The hydrogen concentration of the oxide semiconductor layer 106 at that time is preferably $1 \times 10^{16}$ cm$^{-3}$ or lower. The oxide semiconductor layer 106 preferably has a sufficiently low carrier density (e.g., less than $1 \times 10^{12}$/cm$^3$, preferably less than $1.45 \times 10^{10}$/cm$^3$) as compared to a general silicon wafer having a carrier density of approximately $1 \times 10^{14}$/cm$^3$. Furthermore, the band gap is greater than or equal to 2 eV, preferably greater than or equal to 2.5 eV, further preferably greater than or equal to 3 eV.

At a drain voltage in the range of from 1V to 10V, the off-state current (current flowing between the source and the drain when the gate-source voltage is 0V or lower) is $1 \times 10^{-13}$ A or smaller or the off-state current density (a value obtained by dividing an off-state current by a channel width of a transistor) is 100 aA/μm or lower, preferably 10 aA/μm or lower, and further preferably 1 aA/μm or lower ("a (atto)" denotes a factor of $10^{-18}$), in the case where the channel length is 10 μm and the thickness of the oxide semiconductor layer is 30 nm Note that the resistance when the transistor is off (off-state resistance R) can be calculated using Ohm's law from the off-state current and the drain voltage. Further, the off-state resistivity ρ can be calculated using the formula: ρ=RA/L (R is the off-state resistance), from the cross-sectional area A of the channel formation region and the channel length L. The off-state resistivity is preferably $1 \times 10^9$ Ω·m or higher (or $1 \times 10^{10}$ Ω·m). Here, the cross-section area A can be calculated using the formula: A=dW (d: the thickness of the channel formation region, W: the channel width).

A transistor in which such a purified oxide semiconductor layer 106 is used for a channel formation region can have a reduced off-state current. The flow of the off-state current is caused by generation and recombination of electrons and holes through direct recombination or indirect recombination; however, since an oxide semiconductor layer has a wide band gap and high thermal energy is needed for electronic excitation, direct recombination and indirect recombination are less likely to occur. In the off state, holes which are minority carriers are substantially zero; accordingly, direct recombination and indirect recombination are less likely to occur and the off-state current can be substantially zero. Therefore, the transistor having excellent characteristics, in which the off-state current is reduced and the on-state current and field-effect mobility are increased, can be obtained.

As described above, the purified oxide semiconductor layer serves as a path and carriers are supplied by a source electrode and a drain electrode. When the electron affinity χ and the Fermi level, preferably the Fermi level corresponding to the intrinsic Fermi level of the oxide semiconductor and the work functions of the source electrode and the drain electrode are appropriately selected, carriers can be injected from the source electrode and the drain electrode with the carrier density of the oxide semiconductor layer reduced. Therefore, an n-channel transistor and a p-channel transistor can be manufactured appropriately.

The intrinsic carrier density of the purified oxide semiconductor is extremely low as compared to that of silicon. The intrinsic carrier densities of silicon and an oxide semiconductor can be obtained using approximation expressions of Fermi-Dirac distribution and Boltzmann distribution. The intrinsic carrier density of silicon n, is $1.45 \times 10^{10}$ cm$^{-3}$, and the intrinsic carrier density of an oxide semiconductor (here, an In—Ga—Zn—O layer) is $1.2 \times 10^{-7}$ cm$^{-3}$; the former is approximately $10^{17}$ times as high as the latter. Thus, the intrinsic carrier density of an oxide semiconductor is extremely low as compared to that of silicon.

Depending on the conditions of the first heat treatment and the material of the oxide semiconductor layer 106, part of the oxide semiconductor layer 106 may crystallize in some cases so that a microcrystal or a polycrystal may be formed in the oxide semiconductor layer 106.

The first heat treatment can be performed on the oxide semiconductor layer 106 before being processed into the island-shaped oxide semiconductor layer 106a. In that case, after the first heat treatment, the substrate 100 is taken out of the heating apparatus and a photolithography step is performed.

The first heat treatment has an effect of removing hydrogen, water, and the like and can be referred to as dehydration treatment, dehydrogenation treatment, or the like. The dehydration treatment or dehydrogenation treatment can also be performed after the oxide semiconductor layer is formed or after a source electrode layer and a drain electrode layer are stacked over the oxide semiconductor layer 106a. Such dehydration treatment or dehydrogenation treatment may be conducted more than once.

Figure 3B:
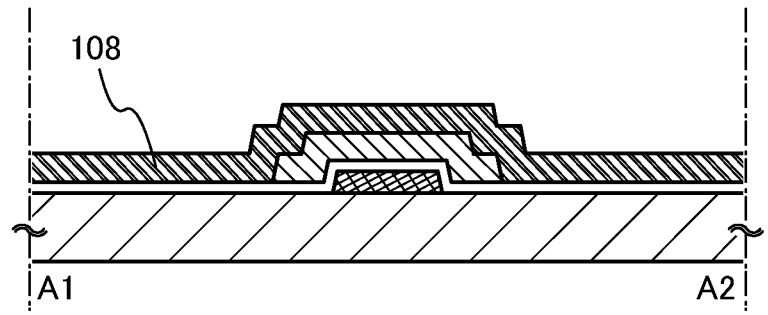

Next, a conductive layer 108 is formed in contact with the oxide semiconductor layer 106a (see FIG. 3B).

The conductive layer 108 can be formed using a PVD method such as a sputtering method, or a CVD method such as a plasma CVD method. The conductive layer 108 can be formed using an element selected from aluminum, chromium, copper, tantalum, titanium, molybdenum, and tungsten, an alloy including any of these elements as a component, or the like. A material including one or more of manganese, magnesium, zirconium, and beryllium may be used. A material including aluminum and one or more of elements selected from titanium, tantalum, tungsten, molybdenum, chromium, neodymium, and scandium may be used.

The conductive layer 108 may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 108 may have a single-layer structure or a stacked structure of two or more layers. For example, a three-layer structure in which an aluminum film is stacked over a titanium film and a titanium film is stacked over the aluminum film, or a three-layer structure in which an aluminum film is stacked over a molybdenum film and a molybdenum film is stacked over the aluminum film can be employed. Alternatively, a two-layer structure in which an aluminum film and a tungsten film are stacked, a two-layer structure in which a copper film and a tungsten film are stacked, or a two-layer structure in which an aluminum film and a molybdenum film are stacked can be employed. Needless to say, the conductive layer 108 may have a single-layer structure or a stacked structure of four or more layers. In the case of the single-layer structure, a single-layer structure of a titanium film is favorably used, for example. In the case of using a single-layer structure of a titanium layer, a favorable tapered shape can be obtained by etching to be performed later. Here, a three-layer structure including a titanium film, an aluminum film, and a titanium film is employed.

A material having a low ability of extracting oxygen (a material having a low oxygen affinity) may be used in a portion of the conductive layer 108, which is in contact with the oxide semiconductor layer 106a. As such a material, titanium nitride, tungsten nitride, and platinum can be given, for example. In a manner similar to the above, the conductive layer 108 may have either a single-layer structure or a stacked structure. In the case of the conductive layer 108 having a stacked structure, a two-layer structure of a titanium nitride film and a titanium film, a two-layer structure of a titanium nitride film and a tungsten film, a two-layer structure of a titanium nitride film and a copper-molybdenum alloy film, a two-layer structure of a tantalum nitride film and a tungsten film, a two-layer structure of a tantalum nitride film and a copper film, a three-layer structure of a titanium nitride film, a tungsten film, and a titanium film, or the like can be employed, for example.

In the case where the material having a low ability of extracting oxygen as described above is used for the conductive layer 108, a change to an n-type in the oxide semiconductor layer due to extraction of oxygen can be prevented; accordingly, an adverse effect to transistor characteristics caused by uneven change to an n-type or the like can be prevented.

In the case of using a material having a high barrier property, such as a titanium nitride film or a tantalum nitride film as described above, in a portion in contact with the oxide semiconductor layer 106a, entry of impurities into the oxide semiconductor layer 106a can be prevented and an adverse effect on transistor characteristics can be reduced.

Figure 3C:
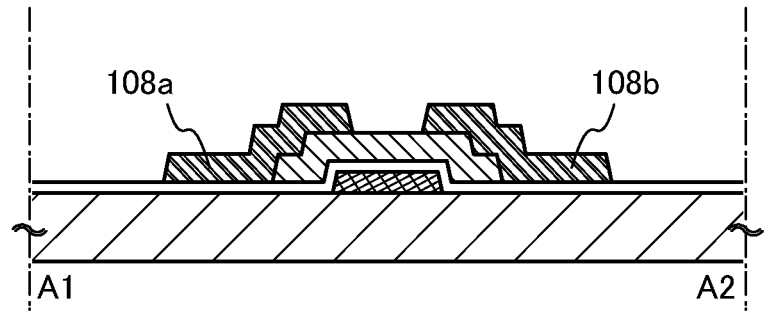

Next, the conductive layer 108 is selectively etched to form a source or drain electrode layer 108a and a source or drain electrode layer 108b (see FIG. 3C). Further, an insulating layer may be formed over the conductive layer 108, and the insulating layer may be etched to form insulating layers having substantially the same shape as the source and drain electrode layers, over the source and drain electrode layers. In this case, capacitance (so-called gate capacitance) between the source and drain electrode layers and the gate electrode can be reduced. Note that the expression "substantially the same" does not necessarily mean "exactly the same" in a strict sense and includes the meaning of being considered as the same. For example, a difference made by a single etching process is acceptable. Further, the thickness does not need to be the same.

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light having a wavelength of several nanometers to several tens of nanometers, which is extremely short. In light exposure using extreme ultraviolet light, resolution is high and depth of focus is large. Therefore, the channel length (L) of a transistor, which is completed later, can be 10 nm to 1000 nm. By a reduction in channel length using such a method, operation speed can be increased. In addition, the off-state current of a transistor including the above-described oxide semiconductor is small; thus, an increase in power consumption due to miniaturization can be suppressed.

The materials and etching conditions of the conductive layer 108 and the oxide semiconductor layer 106a are adjusted as appropriate so that the oxide semiconductor layer 106a is not removed in etching of the conductive layer 108. Note that in some cases, the oxide semiconductor layer 106a is partly etched in the etching step and thus has a groove portion (a depression portion), depending on the materials and the etching conditions.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps. That is, a resist mask corresponding to at least two kinds of different patterns can be formed by using one multi-tone mask. Thus, the number of light-exposure masks can be reduced and the number of corresponding photolithography steps can also be reduced, whereby a process can be simplified.

Figure 4A:
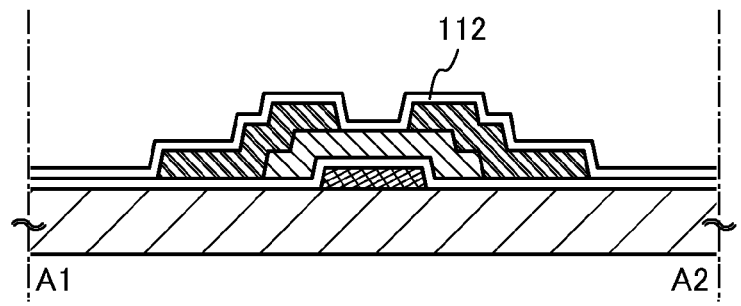
FIGS. 4A to 4C are cross-sectional process views illustrating an embodiment of the present invention.

Next, an insulating layer 112 including oxygen is formed in contact with part of the oxide semiconductor layer 106a, and second heat treatment is performed (see FIG. 4A). The insulating layer 112 including oxygen can be formed by a CVD method, a sputtering method, or the like. The insulating layer 112 including oxygen is preferably formed so as to include silicon oxide, silicon oxynitride, aluminum oxide, hafnium oxide, tantalum oxide, or the like. In particular, the insulating layer 112 including oxygen is preferably a silicon oxide film formed by a sputtering method. The insulating layer 112 including oxygen may have a single-layer structure or a stacked structure. There is no particular limitation on the thickness of the insulating layer 112 including oxygen; for example, the insulating layer 112 including oxygen can have a thickness greater than or equal to 10 nm and less than or equal to 500 nm, preferably greater than or equal to 50 nm and less than or equal to 200 nm.

The second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for 1 hour in a nitrogen atmosphere. By the second heat treatment, oxygen is supplied to the oxide semiconductor layer 106a, so that an oxygen vacancy in the oxide semiconductor layer 106a is reduced, whereby an i-type (intrinsic) or substantially i-type oxide semiconductor layer can be formed. The second heat treatment can reduce variation in electric characteristics of the transistor.

Figure 4B:
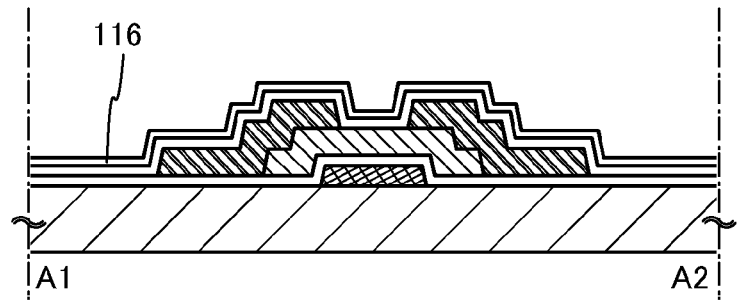

Next, an insulating layer 116 including hydrogen is formed over the insulating layer 112 including oxygen, and third heat treatment is performed (see FIG. 4B). The insulating layer 116 including hydrogen can be formed by a CVD method, a sputtering method, or the like. The insulating layer 116 including hydrogen is preferably formed using an insulating layer including hydrogen, such as a silicon nitride layer, a silicon nitride oxide layer, an aluminum nitride layer, an aluminum nitride oxide layer, or the like. In particular, a silicon nitride layer or a silicon nitride oxide layer formed by a CVD method using at least silane and a gas including nitrogen (typically, a nitrogen gas, an ammonia gas, or the like) as a source gas, or an aluminum nitride layer or an aluminum nitride oxide layer formed by a CVD method using at least aluminum hydride and a gas including nitrogen (typically, a nitrogen gas, an ammonia gas, or the like) as a source gas is preferable because they include a comparatively large number of hydrogen atoms.

The third heat treatment is performed in a nitrogen atmosphere at a temperature higher than or equal to 150° C. and lower than or equal to 450° C., preferably higher than or equal to 250° C. and lower than or equal to 440° C. The atmosphere of the third heat treatment is not limited to the nitrogen atmosphere, and may be an oxygen atmosphere, a rare gas atmosphere, or a dry-air atmosphere.

By the third heat treatment, hydrogen in the insulating layer 116 including hydrogen is diffused into or supplied to at least the oxide semiconductor layer 106a and terminates a defect or a dangling bond remaining in at least one of the oxide semiconductor layer 106a, an interface between the gate insulating layer 102 and the oxide semiconductor layer 106a, and the interface between the oxide semiconductor layer 106a and the insulating layer 112 including oxygen. Thus, defects in the oxide semiconductor layer 106a are reduced. As a result, on-state current and field-effect mobility of the transistor are increased. The supply of hydrogen by the heat treatment is particularly effective when the heat treatment is performed on the i-type oxide semiconductor layer in which defects are sufficiently reduced.

Depending on the conditions of the second heat treatment and the third heat treatment or the material of the oxide semiconductor layer 106, part of the oxide semiconductor layer 106 may crystallize in some cases so that a microcrystal or a polycrystal may be formed in the oxide semiconductor layer 106.

Figure 4C:
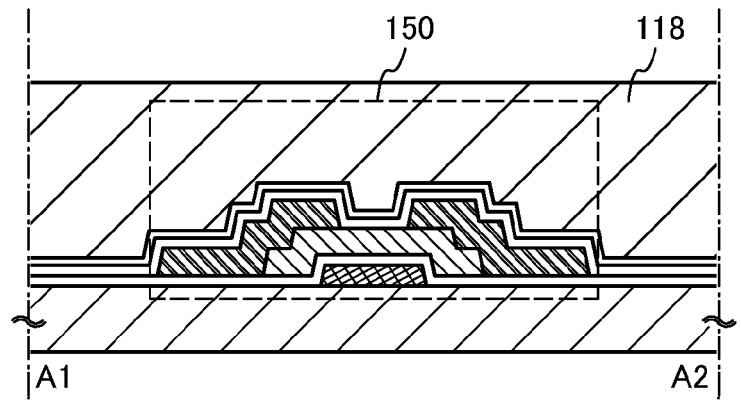

Next, an interlayer insulating layer 118 may be formed over the insulating layer 116 including hydrogen (see FIG. 4C). The interlayer insulating layer 118 can be formed by a PVD method, a CVD method, or the like. The interlayer insulating layer 118 can be formed using a material including an inorganic insulating material such as silicon oxide, silicon nitride oxide, silicon nitride, hafnium oxide, aluminum oxide, or tantalum oxide. Note that although the interlayer insulating layer 118 has a single-layer structure in this embodiment, an embodiment of the disclosed invention is not limited to this example. The interlayer insulating layer 118 may have a stacked structure including two or more layers.

Note that the interlayer insulating layer 118 is desirably formed so as to have a flat surface. This is because an electrode, a wiring, or the like can be favorably formed over the interlayer insulating layer 118 when the interlayer insulating layer 118 is formed so as to have a flat surface.

Through the above-described process, the transistor 150 is completed in which defects are terminated by diffusion of hydrogen which is included in the insulating layer 116 including hydrogen.

Next, another example of the structure of the semiconductor device of this embodiment will be described with reference to FIG. 5. The transistor 150 illustrated in FIG. 5 is a channel-stop transistor.

Figure 5:
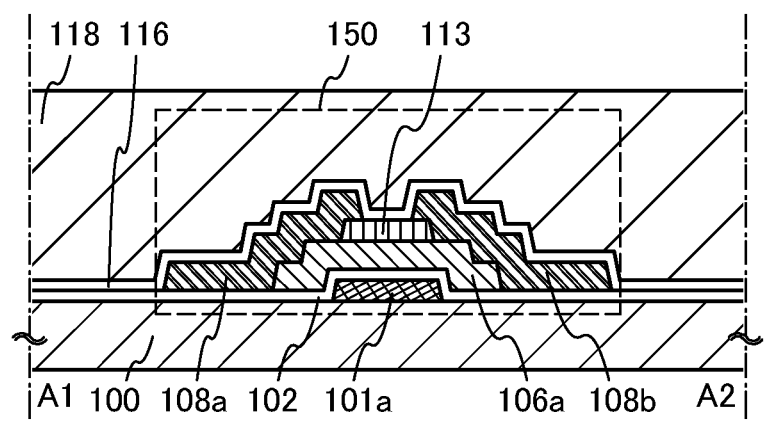
FIG. 5 is a cross-sectional view illustrating an embodiment of the present invention.

In the transistor 150 illustrated in FIG. 5, an insulating layer 113 as a channel stopper is provided in a region overlapping with a channel formation region of the oxide semiconductor layer 106a.

A method for forming the insulating layer 113 provided as a channel stopper will be described. First, the oxide semiconductor layer 106a is formed as illustrated in FIG. 3A, and then an insulating film is formed to cover the oxide semiconductor layer 106a, by a sputtering method, a CVD method, or the like using a material including oxygen atoms, such as silicon oxide or silicon oxynitride. Then, the insulating film is selectively etched, so that the insulating layer 113 can be formed. For the process after formation of the insulating layer 113, description of the process after FIG. 3B can be referred to.

The insulating layer 113 provided as a channel stopper in a region overlapping with the channel formation region of the oxide semiconductor layer 106a can prevent damage (a reduction in film thickness due to plasma or an etchant in etching) at the time of forming the source and drain electrode layers 108a and 108b. Accordingly, reliability of the transistor 150 can be increased.

Using the method described in this embodiment, a transistor having high field-effect mobility and large on-state current can be realized. Further, a transistor having small off-state current, high field-effect mobility, and large on-state current can be realized.

The structures, methods, and the like described in this embodiment can be combined as appropriate with any of the structures, methods, and the like described in the other embodiments.

Embodiment 3

In this embodiment, another structure and another manufacturing method of the semiconductor device of the above embodiment will be described. In this embodiment, a top-gate transistor will be described.

<Structure of a Semiconductor Device>

First, the transistor 150 which is an example of the structure of a semiconductor device of this embodiment will be described. In the transistor 150 illustrated in FIG. 6D, the oxide semiconductor layer 106a is formed over the substrate 100, and the source and drain electrode layers 108a and 108b are formed over the oxide semiconductor layer 106a. The insulating layer 112 including oxygen is formed so as to cover the source and drain electrode layers 108a and 108b and the oxide semiconductor layer 106a. The insulating layer 112 functions as a gate insulating layer. The insulating layer 112 including oxygen is in contact with a channel of the oxide semiconductor layer 106a. In addition, a gate electrode layer 114 is formed over the insulating layer 112 so as to overlap with the oxide semiconductor layer 106a. Further, the insulating layer 116 including hydrogen is formed so as to cover the insulating layer 112 including oxygen and the gate electrode layer 114. The insulating layer 118 functioning as a planarization film may be formed over the insulating layer 116 including hydrogen. The transistor 150 described in this embodiment includes the insulating layer 112 including oxygen, which is in contact with the oxide semiconductor layer 106a, and the insulating layer 116 including hydrogen, which is in contact with the insulating layer 112 including oxygen. Note that the insulating layer 102 functioning as a base film may be formed between the substrate 100 and the oxide semiconductor layer 106a.

<Manufacturing Method of a Semiconductor Device>

Next, a manufacturing method of the transistor 150 which is an example of the structure of the semiconductor device will be described with reference to FIGS. 6A to 6D.

First, over the substrate 100 over which the insulating layer 102 functioning as a base film is formed, the oxide semiconductor layer 106a is formed. Then, the source and drain electrode layers 108a and 108b are formed over the oxide semiconductor layer 106a (see FIG. 6A).

For the substrate 100, description of the substrate 100 of FIG. 2A can be referred to; therefore, detailed description thereof will be omitted.

The insulating layer 102 functioning as a base film can be formed using a CVD method, a sputtering method, or the like.

The insulating layer 102 is preferably formed so as to include silicon oxide, silicon nitride, silicon oxynitride, silicon nitride oxide, aluminum oxide, hafnium oxide, or tantalum oxide. The insulating layer 102 may have either a single-layer structure or a stacked structure. The thickness of the insulating layer 102 can be larger than or equal to 10 nm and less than or equal to 500 nm, for example. In the case of using a sputtering method or the like, it is preferable that the insulating layer 102 be formed in a state where moisture remaining in the treatment chamber is removed.

The oxide semiconductor layer is formed over the substrate 100 or the insulating layer 102 by a sputtering method or the like. For the material and the formation method of the oxide semiconductor layer, description of the oxide semiconductor layer 106a of FIG. 2C can be referred to; therefore, detailed description thereof will be omitted.

In this embodiment, as the oxide semiconductor layer 106a, an amorphous oxide semiconductor layer is formed by a sputtering method using a target for depositing an In—Ga—Zn—O-based oxide semiconductor.

Note that before the oxide semiconductor layer is formed by a sputtering method, reverse sputtering in which plasma is generated with an argon gas introduced is preferably performed so that a material attached to the surface of the insulating layer 102 is removed.

Next, the oxide semiconductor layer is processed into the island-shaped oxide semiconductor layer 106a using a method such as etching using a mask. As a method for etching the oxide semiconductor layer, either dry etching or wet etching or both of them in combination may be employed. For etching conditions of the oxide semiconductor layer, description in Embodiment 2 can be referred to; therefore, detailed description thereof will be omitted.

Next, the first heat treatment (dehydration treatment, dehydrogenation treatment) is preferably performed on the oxide semiconductor layer 106a. Water (including a hydroxyl group), hydrogen, or the like in the oxide semiconductor layer 106a can be removed by the first heat treatment. For conditions of the first heat treatment, description in Embodiment 2 can be referred to; therefore, detailed description thereof will be omitted.

The first heat treatment can be performed on the oxide semiconductor layer before being processed into the island-shaped oxide semiconductor layer 106a. In that case, after the first heat treatment, the substrate 100 is taken out of the heating apparatus and a photolithography step is performed.

Figure 6A:
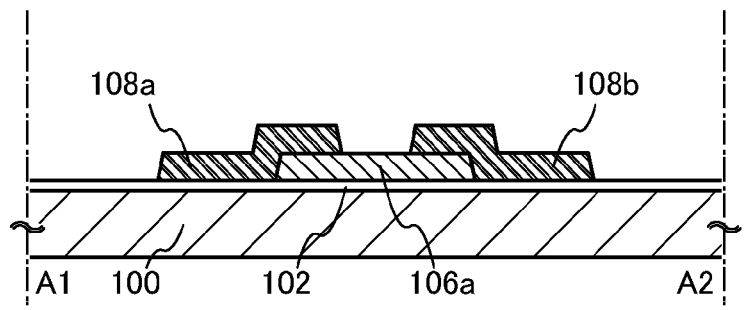
FIGS. 6A to 6D are cross-sectional process views illustrating an embodiment of the present invention.
Figure 6B:
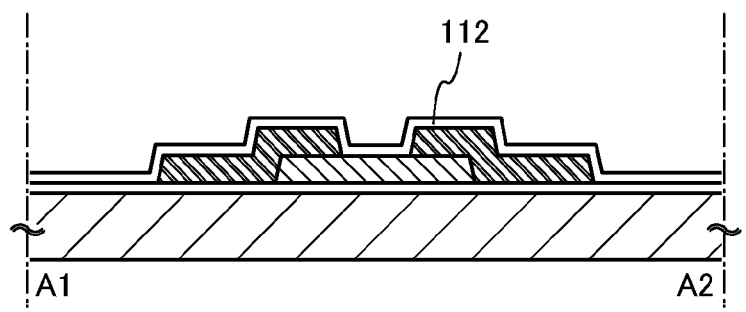

Next, the insulating layer 112 is formed so as to cover the oxide semiconductor layer 106a and the source and drain electrode layers 108a and 108b (see FIG. 6B).

The insulating layer 112 functions as a gate insulating layer. The insulating layer 112 is preferably formed so as to include oxygen atoms, for example, using silicon oxide, silicon oxynitride, or the like. The insulating layer 112 is preferably formed using a sputtering method or a CVD method.

Next, the second heat treatment is preferably performed on the oxide semiconductor layer 106a. By the second heat treatment, oxygen in the insulating layer 112 including oxygen is supplied to the oxide semiconductor layer 106a, so that an oxygen vacancy portion in the oxide semiconductor layer 106a is oxidized, whereby the i-type (intrinsic) or substantially i-type oxide semiconductor layer 106a can be formed. The second heat treatment can reduce variation in electric characteristics of the transistor. For conditions of the second heat treatment, description in Embodiment 2 can be referred to; therefore, detailed description thereof will be omitted.

Figure 6C:
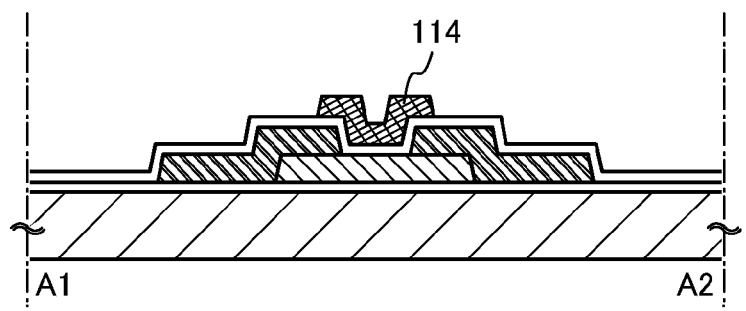

Next, the gate electrode layer 114 is formed over the insulating layer 112 including oxygen so as to overlap with the oxide semiconductor layer 106a (see FIG. 6C).

First, a conductive layer is formed over the insulating layer 112 including oxygen by a sputtering method or a CVD method. For the material and the formation method of the conductive layer, description of the conductive layer 101 of FIG. 2A can be referred to; therefore, detailed description thereof will be omitted. Then, the conductive layer is selectively etched, so that the gate electrode layer 114 is formed.

Figure 6D:
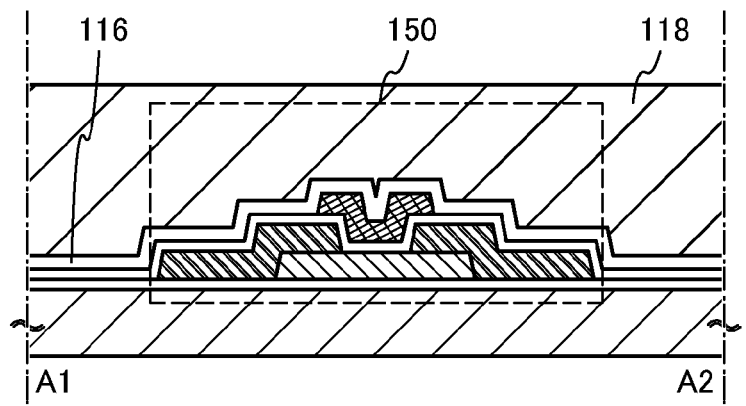

Next, the insulating layer 116 including hydrogen is formed so as to cover the gate electrode layer 114, and the insulating layer 118 functioning as a planarization film is formed (see FIG. 6D).

As the insulating layer 116 including hydrogen, a film including hydrogen is formed using silicon nitride, silicon nitride oxide, aluminum nitride, aluminum nitride oxide, or the like. The insulating layer 116 including hydrogen is preferably formed by a sputtering method or a CVD method. In particular, a silicon nitride layer or a silicon nitride oxide layer formed by a CVD method using at least silane and a gas including nitrogen (typically, a nitrogen gas, an ammonia gas, or the like) as a source gas, or an aluminum nitride layer or an aluminum nitride oxide layer formed by a CVD method using at least aluminum hydride and a gas including nitrogen (typically, a nitrogen gas, an ammonia gas, or the like) as a source gas is preferable because they include a comparatively large number of hydrogen atoms. It is preferable to form the insulating layer 116 including hydrogen so as to be in contact with the insulating layer 112 including oxygen.

Next, the third heat treatment is performed on the oxide semiconductor layer 106a. For conditions of the third heat treatment, description in Embodiment 2 can be referred to; therefore, detailed description thereof will be omitted. By the third heat treatment, hydrogen in the insulating layer 116 including hydrogen is diffused into or supplied to at least the oxide semiconductor layer 106a and terminates a defect or a dangling bond included in at least one of the oxide semiconductor layer 106a, the interface between the oxide semiconductor layer 106a and the insulating layer 112 including oxygen, and an interface between the oxide semiconductor layer 106a and the insulating layer 102. Thus, defects in the oxide semiconductor layer 106a are reduced. As a result, on-state current and field-effect mobility of the transistor are increased.

The insulating layer 118 can be formed by a sputtering method, a CVD method, or the like. For the material and the formation method of the insulating layer 118, description of FIG. 4C can be referred to; therefore, detailed description thereof will be omitted.

Through the above-described process, the transistor 150 including the oxide semiconductor layer 106a is completed.

On the transistor 150 of this embodiment, the first heat treatment is performed in an atmosphere which includes little hydrogen and moisture (a nitrogen atmosphere, an oxygen atmosphere, a dry-air atmosphere (e.g., as for moisture, the dew point is −40° C. or lower, preferably −50° C. or lower), or the like) at a temperature higher than or equal to 400° C. and lower than or equal to 750° C., preferably higher than or equal to 400° C. and lower than the strain point of the substrate, so that the hydrogen concentration of the oxide semiconductor layer 106a is reduced. Next, the insulating layer 112 including oxygen in contact with the oxide semiconductor layer 106a is formed, and then the second heat treatment is performed in an inert gas atmosphere or an oxygen gas atmosphere (preferably at a temperature higher than or equal to 200° C. and lower than or equal to 450° C., and for example at a temperature higher than or equal to 250° C. and lower than or equal to 350° C.), so that the oxygen vacancy portion in the oxide semiconductor layer 106a is oxidized. Thus, the i-type (intrinsic) or substantially i-type semiconductor layer 106a is formed. Next, the insulating layer 116 including hydrogen is formed over the insulating layer 112 including oxygen. Then, the third heat treatment is performed at a temperature higher than or equal to 150° C. and lower than or equal to 450° C., preferably higher than or equal to 250° C. and lower than or equal to 440° C., whereby hydrogen in the insulating layer 116 including hydrogen is supplied to at least one of the interface between the insulating layer 102 and the oxide semiconductor layer 106a, the oxide semiconductor layer 106a, and the interface between the oxide semiconductor layer 106a and the insulating layer 112 including oxygen. The hydrogen terminates a defect or a dangling bond included in the oxide semiconductor layer 106a. In this manner, transistor characteristics can be improved.

Note that depending on the conditions of the first heat treatment, the second heat treatment, and the third treatment or the material of the oxide semiconductor layer 106a, part of the oxide semiconductor layer 106a may crystallize in some cases so that a microcrystal or a polycrystal may be formed in the oxide semiconductor layer 106a. When the oxide semiconductor layer 106a has a structure in which a crystalline region is included in an amorphous region, a transistor having high field-effect mobility and large on-state current can be obtained. In the case where the oxide semiconductor layer 106a has an amorphous structure, characteristic variation among a plurality of elements can be reduced.

The structures, methods, and the like described in this embodiment can be combined as appropriate with any of the structures, methods, and the like described in the other embodiments.

Embodiment 4

In this embodiment, another structure and another manufacturing method of the semiconductor device of the above embodiment will be described.

<Structure of a Semiconductor Device>

First, the transistor 150 which is an example of the structure of a semiconductor device of this embodiment will be described. In the transistor 150 illustrated in FIG. 7D, the gate electrode layer 101a is formed over the substrate 100, and the gate insulating layer 102 is formed over the gate electrode layer 101a. The oxide semiconductor layer 106a, as a channel formation region, is formed over the gate insulating layer 102, and the source or drain electrode layer 108a and the source or drain electrode layer 108b are formed over the oxide semiconductor layer 106a. The insulating layer 112 including oxygen is formed over the source and drain electrode layers 108a and 108b and the oxide semiconductor layer 106a. The insulating layer 112 including oxygen is in contact with a back channel of the oxide semiconductor layer 106a. The gate electrode layer 114 is formed over the insulating layer 112 including oxygen so as to overlap with the oxide semiconductor layer 106a. The insulating layer 116 including hydrogen is formed so as to cover the gate electrode layer 114. The insulating layer 118 functioning as a planarization film may be formed over the insulating layer 116 including hydrogen. The transistor 150 described in this embodiment has a feature of including the insulating layer 112 including oxygen in contact with the oxide semiconductor layer 106a and the insulating layer 116 including hydrogen in contact with the insulating layer 112 including oxygen.

In this embodiment, the gate electrode layer 114 functions as a so-called back gate. By the existence of the gate electrode layer 114, electric field in the oxide semiconductor layer 106a can be controlled, whereby electric characteristics of the transistor 150 can be controlled. Note that the gate electrode layer 114 may be electrically connected to another wiring, electrode, or the like so that a potential is applied to the gate electrode layer 114, or may be insulated so as to be in a floating state.

Note that a "gate electrode" commonly means a gate electrode whose potential can be controlled intentionally; however, a "gate electrode" in this specification also means a gate electrode whose potential is not intentionally controlled. For example, the conductive layer which is insulated and in a floating state as described above is, in some cases, called a "gate electrode layer."

<Manufacturing Method of a Semiconductor Device>

Next, a manufacturing method of the transistor 150 which is an example of the structure of the semiconductor device will be described with reference to FIGS. 7A to 7D.

First, the gate electrode layer 101a is formed over the substrate 100, and the gate insulating layer 102 is formed so as to cover the gate electrode layer 101a. Next, the oxide semiconductor layer 106a is formed over the gate insulating layer 102 so as to overlap with the gate electrode layer 101a, and then the source or drain electrode layer 108a and the source or drain electrode layer 108b are formed (see FIG. 7A). For the process up to this point, description of FIGS. 2A to 2C and FIGS. 3A to 3C can be referred to; therefore, detailed description thereof will be omitted.

Figure 7A:
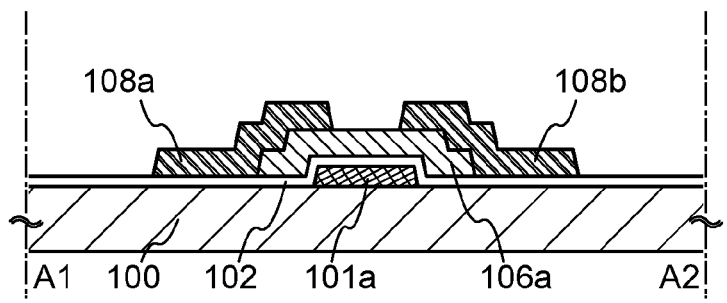
FIGS. 7A to 7D are cross-sectional process views illustrating an embodiment of the present invention.
Figure 7B:
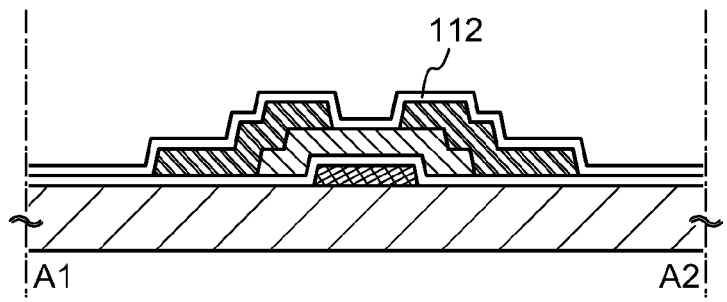

Then, the insulating layer 112 including oxygen is formed so as to cover the oxide semiconductor layer 106a and the source and drain electrode layers 108a and 108b (see FIG. 7B). For the material and the formation method of the insulating layer 112 including oxygen, description of FIG. 4A can be referred to; therefore, detailed description thereof will be omitted.

Next, the second heat treatment is preferably performed on the oxide semiconductor layer 106a. By the second heat treatment, oxygen in the insulating layer 112 including oxygen is supplied to the oxide semiconductor layer 106a, so that the oxygen vacancy portion in the oxide semiconductor layer 106a is oxidized, whereby the i-type (intrinsic) or substantially i-type oxide semiconductor layer 106a can be formed. The second heat treatment can reduce variation in electric characteristics of the transistor. For conditions of the second heat treatment, description in Embodiment 2 can be referred to; therefore, detailed description thereof will be omitted.

Figure 7C:
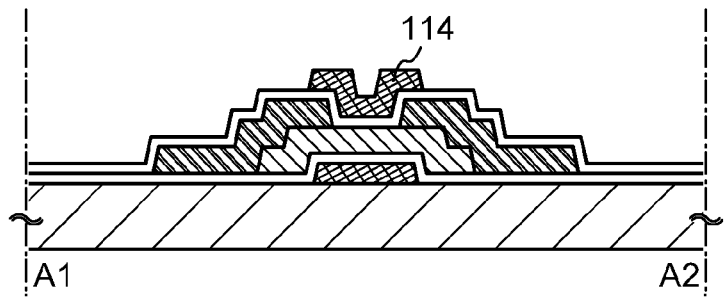

Next, the gate electrode layer 114 is formed over the insulating layer 112 including oxygen so as to overlap with the oxide semiconductor layer 106a (see FIG. 7C). For the material and the formation method of the gate electrode layer 114, description of the gate electrode layer 114 of FIG. 6C can be referred to; therefore, detailed description thereof will be omitted. In this embodiment, the gate electrode layer 114 functions as a so-called back gate.

Figure 7D:
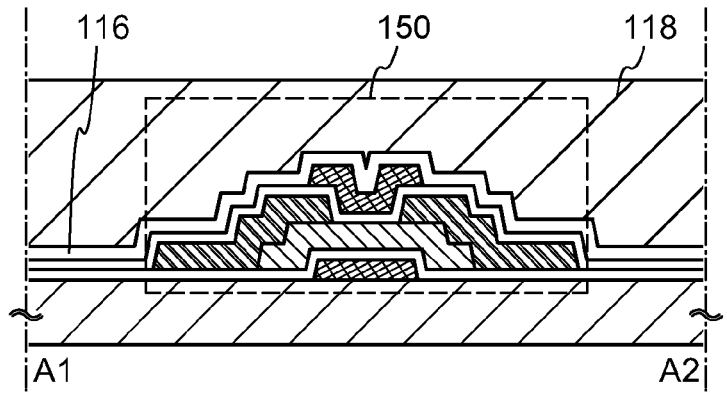

Then, the insulating layer 116 including hydrogen is formed so as to cover the gate electrode layer 114, and the insulating layer 118 is formed (see FIG. 7D).

For the material and the formation method of the insulating layer 116 including hydrogen, description of the insulating layer 116 of FIG. 4B can be referred to; therefore, detailed description thereof will be omitted.

Next, the third heat treatment is performed on the oxide semiconductor layer 106a. For conditions of the third heat treatment, description in Embodiment 2 can be referred to; therefore, detailed description thereof will be omitted. By the third heat treatment, hydrogen in the insulating layer 116 including hydrogen is diffused into or supplied to at least the oxide semiconductor layer 106a and terminates a defect or a dangling bond included in at least one of the oxide semiconductor layer 106a, the interface between the oxide semiconductor layer 106a and the insulating layer 112 including oxygen, and the interface between the oxide semiconductor layer 106a and the insulating layer 102. Thus, defects in the oxide semiconductor layer 106a are reduced. As a result, on-state current and field-effect mobility of the transistor are increased.

For the material and the formation method of the insulating layer 118, description of the insulating layer 118 of FIG. 4C can be referred to; therefore, detailed description thereof will be omitted.

Through the above-described process, the transistor 150 including the oxide semiconductor layer 106a is completed.

On the transistor 150 of this embodiment, the first heat treatment is performed in an atmosphere which includes little hydrogen and moisture (a nitrogen atmosphere, an oxygen atmosphere, a dry-air atmosphere (e.g., as for moisture, the dew point is −40° C. or lower, preferably −50° C. or lower), or the like) at a temperature higher than or equal to 400° C. and lower than or equal to 750° C., preferably higher than or equal to 400° C. and lower than the strain point of the substrate, so that the hydrogen concentration of the oxide semiconductor layer 106a is reduced. Next, the insulating layer 112 including oxygen in contact with the oxide semiconductor layer 106a is formed, and then the second heat treatment is performed in an inert gas atmosphere or an oxygen gas atmosphere (preferably at a temperature higher than or equal to 200° C. and lower than or equal to 450° C., and for example at a temperature higher than or equal to 250° C. and lower than or equal to 350° C.), so that the oxygen vacancy portion in the oxide semiconductor layer 106a is oxidized. Thus, the i-type (intrinsic) or substantially i-type semiconductor layer 106a is formed. Next, the insulating layer 116 including hydrogen is formed over the insulating layer 112 including oxygen. Then, the third heat treatment is performed at a temperature higher than or equal to 150° C. and lower than or equal to 450° C., preferably higher than or equal to 250° C. and lower than or equal to 440° C., whereby hydrogen in the insulating layer 116 including hydrogen is supplied to at least one of the interface between the gate insulating layer 102 and the oxide semiconductor layer 106a, the oxide semiconductor layer 106a, and the interface between the oxide semiconductor layer 106a and the insulating layer 112 including oxygen. The hydrogen terminates a defect or a dangling bond included in the oxide semiconductor layer 106a. In this manner, transistor characteristics can be improved.

Note that depending on the conditions of the first heat treatment, the second heat treatment, and the third treatment or the material of the oxide semiconductor layer 106a, part of the oxide semiconductor layer 106a may crystallize in some cases so that a microcrystal or a polycrystal may be formed in the oxide semiconductor layer 106a. When the oxide semiconductor layer 106a has a structure in which a crystalline region is included in an amorphous region, a transistor having high field-effect mobility and large on-state current can be obtained. In the case where the oxide semiconductor layer 106a has an amorphous structure, characteristic variation among a plurality of elements can be reduced.

The structures, methods, and the like described in this embodiment can be combined as appropriate with any of the structures, methods, and the like described in the other embodiments.

Embodiment 5

In this embodiment, another example of the manufacturing method of a semiconductor device of the above embodiment will be described.

First, a conductive layer is formed over a substrate having an insulating surface, and the conductive layer is selectively etched to form a gate electrode layer. Then, a gate insulating layer is formed so as to cover the gate electrode layer. This process can be conducted in a manner similar to that of Embodiment 2, and the corresponding description in Embodiment 2 can be referred to.

Next, an amorphous oxide semiconductor layer is formed over the gate insulating layer, and is processed into an island-shaped oxide semiconductor layer by a method such as etching. This process is conducted using the method described in Embodiment 2 except the heat treatment of the oxide semiconductor layer. In this embodiment, heat treatment of the oxide semiconductor layer is not performed.

Then, a conductive layer is formed in contact with the oxide semiconductor layer, and the conductive layer is selectively etched to form a source electrode layer and a drain electrode layer. This process can be conducted in a manner similar to that of Embodiment 2, and the corresponding description in Embodiment 2 can be referred to.

Next, an insulating layer in contact with part of the oxide semiconductor layer is formed. The insulating layer may have any structure as long as hydrogen can be diffused and supplied from the insulating layer including hydrogen to the oxide semiconductor layer in a later step. The insulating layer can be formed by a CVD method, a sputtering method, or the like. The following method as described in Embodiment 2 may be employed: an insulating layer including oxygen is formed and heat treatment is performed to supply oxygen to the oxide semiconductor layer; in such a case, a method similar to that described in Embodiment 2 may be employed.

Then, an insulating layer including hydrogen is formed over the insulating layer, and heat treatment is performed. The insulating layer including hydrogen can be formed by a CVD method, a sputtering method, or the like. The insulating layer including hydrogen is preferably formed using an insulating layer including hydrogen, such as a silicon nitride layer, a silicon nitride oxide layer, an aluminum nitride layer, an aluminum nitride oxide layer, or the like. In particular, a silicon nitride layer or a silicon nitride oxide layer formed by a CVD method using at least silane and a gas including nitrogen (typically, a nitrogen gas, an ammonia gas, or the like) as a source gas, or an aluminum nitride layer or an aluminum nitride oxide layer formed by a CVD method using at least aluminum hydride and a gas including nitrogen (typically, a nitrogen gas, an ammonia gas, or the like) as a source gas is preferable because they include a comparatively large number of hydrogen atoms.

The heat treatment is performed in a nitrogen atmosphere at a temperature higher than or equal to 150° C. and lower than or equal to 450° C., preferably higher than or equal to 250° C. and lower than or equal to 440° C. The atmosphere of the heat treatment is not limited to the nitrogen atmosphere, and may be an oxygen atmosphere, a rare gas atmosphere, or a dry-air atmosphere.

By the heat treatment, hydrogen in the insulating layer including hydrogen is diffused into or supplied to at least the oxide semiconductor layer and terminates a defect or a dangling bond remaining in at least one of the oxide semiconductor layer, the interface between the gate insulating layer and the oxide semiconductor layer, and the interface between the oxide semiconductor layer and the insulating layer including oxygen. Thus, defects in the oxide semiconductor layer are reduced, and transistor characteristics are improved. As a result, on-state current and field-effect mobility of the transistor are increased.

Through the above-described process, a transistor is completed in which defects are terminated by diffusion of hydrogen which is included in the insulating layer including hydrogen.

Although a bottom-gate transistor has been described in this embodiment, the present invention is not limited to this structure and a top-gate transistor or a transistor including a so-called back gate may be employed.

Using the method described in this embodiment, a transistor having high field-effect mobility and large on-state current can be realized.

The structures, methods, and the like described in this embodiment can be combined as appropriate with any of the structures, methods, and the like described in the other embodiments.

Embodiment 6

In this embodiment, the case where thin film transistors whose on-state current and field-effect mobility are increased by supply of hydrogen are manufactured and a semiconductor device (also referred to as a display device) having a display function in which the thin film transistors are used for a pixel portion and a driver circuit is manufactured will be described. Furthermore, when a part or whole of a driver circuit is formed over the same substrate as a pixel portion, a system-on-panel can be obtained.

Figure 8A:
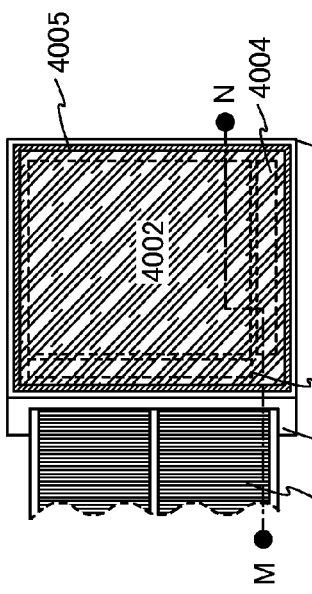
FIGS. 8A and 8B are a top view and a cross-sectional view, respectively, illustrating an embodiment of the present invention.
Figure 8B:
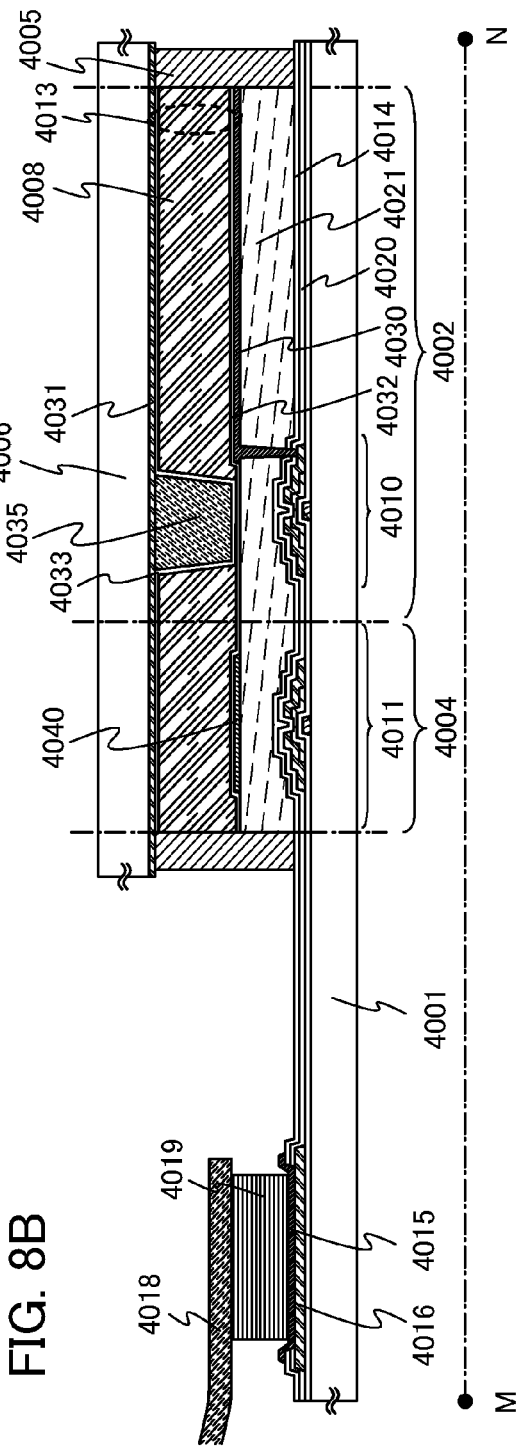

In this embodiment, an example of a liquid crystal display device is described as a semiconductor device which is an embodiment of the present invention. First, the appearance and a cross section of a liquid crystal display panel, which is an embodiment of a semiconductor device, will be described with reference to FIGS. 8A and 8B. FIG. 8A is a top view of a panel in which transistors 4010 and 4011 which include a semiconductor layer of an oxide material to which hydrogen is supplied, and a liquid crystal element 4013 are sealed between a first substrate 4001 and a second substrate 4006 with a sealant 4005. FIG. 8B corresponds to a cross-sectional view of FIG. 8A along line M-N.

The sealant 4005 is provided so as to surround a pixel portion 4002, a signal line driver circuit 4003, and a scan line driver circuit 4004 which are provided over the first substrate 4001. The second substrate 4006 is provided over the pixel portion 4002, the signal line driver circuit 4003, and the scan line driver circuit 4004. Thus, the pixel portion 4002, the signal line driver circuit 4003, and the scan line driver circuit 4004 are sealed together with a liquid crystal layer 4008 by the first substrate 4001, the sealant 4005, and the second substrate 4006.

Further, the pixel portion 4002, the signal line driver circuit 4003, and the scan line driver circuit 4004, which are provided over the first substrate 4001, include a plurality of transistors. FIG. 8B illustrates the transistor 4010 included in the pixel portion 4002 and the transistor 4011 included in the scan line driver circuit 4004, as an example. Insulating layers 4020 and 4021 are provided over the transistor 4010, and the transistor 4011.

Any of the transistors including the oxide semiconductor layer to which hydrogen is supplied, which are described in the above embodiments, can be used as the transistors 4010 and 4011. In this embodiment, the transistors 4010 and 4011 are n-channel transistors.

A conductive layer 4040 is provided over the insulating layer 4021 at a position overlapping with a channel formation region of an oxide semiconductor layer in the transistor 4011 for the driver circuit. The conductive layer 4040 is provided at the position overlapping with the channel formation region of the oxide semiconductor layer, whereby the amount of change in threshold voltage of the transistor 4011 in the BT test can be reduced. The potential of the conductive layer 4040 may be the same or different from that of a gate electrode layer of the transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 arranged therebetween.

As the second substrate 4006, glass or plastics can be used.

A spacer 4035 is a columnar spacer obtained by selective etching of an insulating layer and is provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the transistor 4010 is formed. The counter electrode layer 4031 and the common potential line can be electrically connected to each other through conductive particles provided between the pair of substrates using the common connection portion. Note that the conductive particles are included in the sealant 4005.

A liquid crystal exhibiting a blue phase for which an alignment film is unnecessary may be used. A blue phase is one of liquid crystal phases, and is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including a liquid crystal exhibiting a blue phase and a chiral agent has a short response time of 1 msec or less and is optically isotropic; therefore, alignment treatment is unnecessary and viewing angle dependence is small.

In addition, since rubbing treatment is unnecessary in the case of using a liquid crystal exhibiting a blue phase, electrostatic discharge damage caused by the rubbing treatment can be prevented and defects and damage of the liquid crystal display device can be reduced in the manufacturing process. Thus, productivity of the liquid crystal display device can be increased. A transistor that uses an oxide semiconductor layer particularly has a possibility that electric characteristics of the transistor may fluctuate significantly by the influence of static electricity and deviate from the designed range. Therefore, it is more effective to use a blue phase liquid crystal material for a liquid crystal display device including a transistor that uses an oxide semiconductor layer. Note that in the case where a blue phase is used, an embodiment of the present invention is not limited to the structure of FIGS. 8A and 8B, and a structure of a so-called horizontal electric field mode may be employed, in which an electrode layer corresponding to the counter electrode layer 4031 is formed on the substrate side which is provided with the pixel electrode layer 4030.

Although a transmissive liquid crystal display device is described in this embodiment, an embodiment of the present invention can also be applied to a reflective liquid crystal display device or a transflective liquid crystal display device.

Although a polarizing plate is provided on the outer surface of the substrate (on the viewer side) and a coloring layer (a color filter) and an electrode layer used for a display element are sequentially provided on the inner surface of the substrate in the liquid crystal display device described in this embodiment, the polarizing plate may be provided on the inner surface of the substrate. The stacked structure of the polarizing plate and the coloring layer is not limited to that of this embodiment and may be set as appropriate depending on materials of the polarizing plate and the coloring layer or conditions of the manufacturing process. Furthermore, a light-blocking layer serving as a black matrix may be provided as needed.

In this embodiment, in order to reduce the surface roughness due to the transistor and to improve the reliability of the transistor, the transistors are covered with insulating layers (insulating layers 4020, 4014, and 4021) functioning as a protective layer or a planarization insulating layer. Note that the protective layer is provided to prevent entry of contaminant impurities such as an organic substance, metal, and moisture existing in the air and is preferably a dense film. The protective layer may be formed by a sputtering method to have a single-layer structure or a stacked structure including any of a silicon oxide film, a silicon nitride film, a silicon oxynitride film, a silicon nitride oxide film, an aluminum oxide film, an aluminum nitride film, an aluminum oxynitride film, and an aluminum nitride oxide film.

In this embodiment, the insulating layer having a stacked structure is formed as a protective layer. Here, a silicon oxide layer is formed using a sputtering method as the first-layer insulating layer 4020. When a silicon oxide layer is used as a protective layer, oxygen is added to the oxide semiconductor layer that is in contact with the protective layer, so that an oxygen vacancy can be reduced.

As a second layer of the protective layer, the insulating layer 4014 is formed. Here, as the second-layer insulating layer 4014, a silicon nitride layer containing hydrogen is formed using a plasma CVD method and is subjected to heat treatment, so that hydrogen is diffused into the oxide semiconductor layer. The use of the silicon nitride layer as the protective layer can prevent ions of sodium or the like from entering a semiconductor region, so that variation in electric characteristics of the transistor can be suppressed.

The insulating layer 4021 is formed as a planarization insulating layer. The insulating layer 4021 can be formed using a heat-resistant organic material such as polyimide, an acrylic resin, benzocyclobutene, polyamide, or an epoxy resin. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Further, a variety of signals and potentials are supplied to the signal line driver circuit 4003, the scan line driver circuit 4004, and the pixel portion 4002, which are formed over the same substrate, from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as source and drain electrode layers of the transistors 4010 and 4011.

The connection terminal electrode 4015 is electrically connected to a terminal included in the FPC 4018 via an anisotropic conductive film 4019.

In addition, if needed, a color filter is provided in each pixel. Further, a polarization plate and a diffusing plate are provided on the outer sides of the first substrate 4001 and the second substrate 4006. Further, a light source of a backlight is formed using a cold-cathode tube or an LED. Thus, a liquid crystal display module is obtained.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above-described process, a liquid crystal display device can be manufactured.

The transistors including an oxide semiconductor layer to which hydrogen is supplied, which are described in the above embodiments, have high field-effect mobility. When a liquid crystal display device is manufactured using such a transistor as in this embodiment, a liquid crystal display device having excellent display characteristics is realized.

This embodiment can be implemented in combination with any of the structures described in the other embodiments as appropriate.

Embodiment 7

Figure 9A:
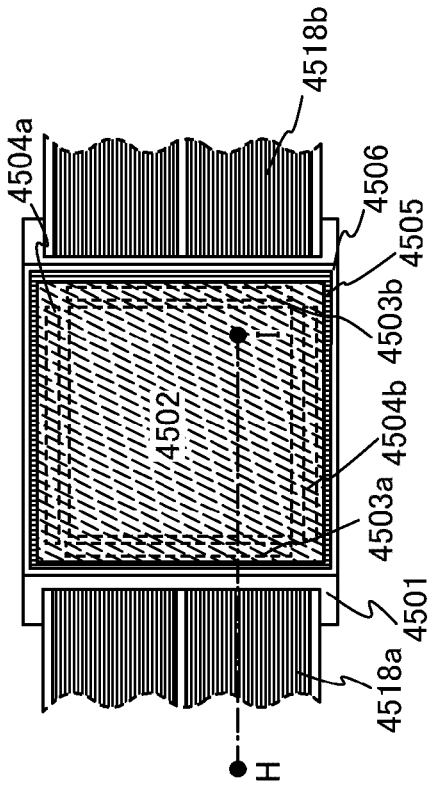
FIGS. 9A and 9B are a top view and a cross-sectional view, respectively, illustrating an embodiment of the present invention.
Figure 9B:
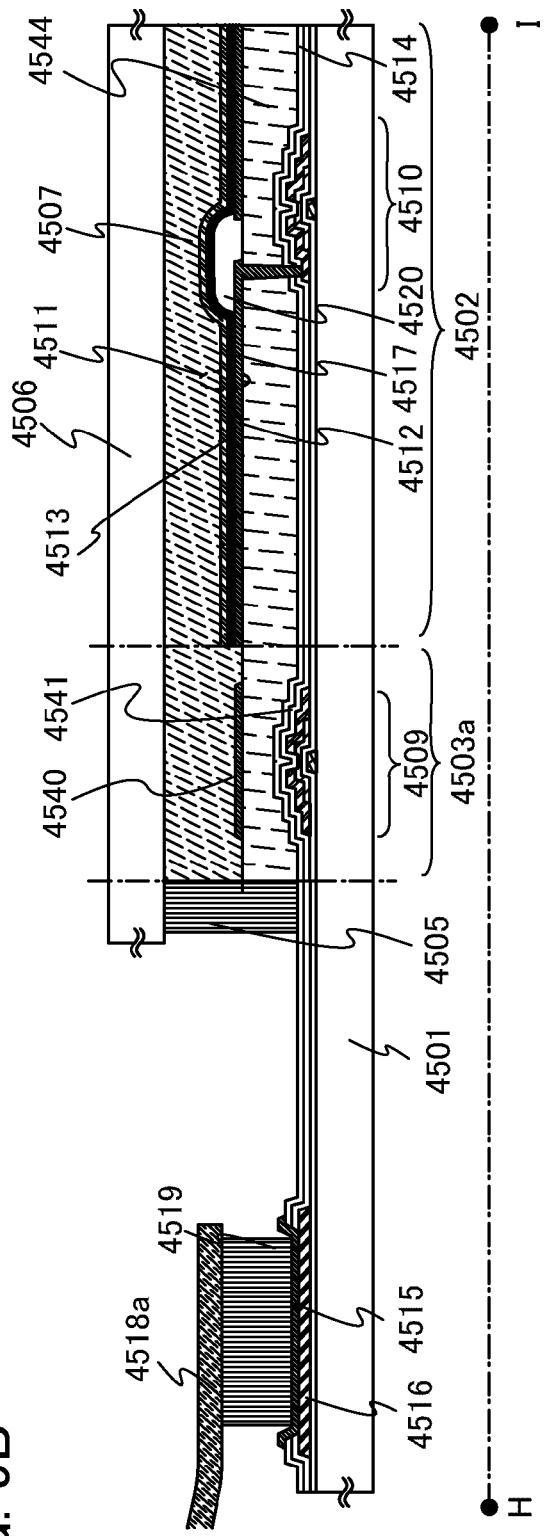

The appearance and a cross section of a light-emitting display panel (also referred to as a light-emitting panel), which is an embodiment of a semiconductor device, will be described with reference to FIGS. 9A and 9B. FIG. 9A is a plan view of a panel in which a transistor including an oxide semiconductor layer to which hydrogen is supplied and a light-emitting element are sealed between a first substrate and a second substrate with a sealant. FIG. 9B corresponds to a cross-sectional view of FIG. 9A along line H-I.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 include a plurality of transistors, and a transistor 4510 included in the pixel portion 4502 and a transistor 4509 included in the signal line driver circuit 4503a are illustrated as an example in FIG. 9B.

For the transistors 4509 and 4510, any of the transistors having high mobility which include an oxide semiconductor layer to which hydrogen is supplied can be used. In this embodiment, the transistors 4509 and 4510 are n-channel transistors.

A conductive layer 4540 is provided over an insulating layer 4544 at a position overlapping with a channel formation region of an oxide semiconductor layer of the transistor 4509 for the driver circuit. The conductive layer 4540 may have a potential which is the same as or different from that of a gate electrode layer of the transistor 4509, and can function as a second gate electrode layer. The potential of the conductive layer 4540 may be GND, 0 V or in a floating state.

In the transistor 4509, an insulating layer 4541 is formed as a protective insulating layer so as to be in contact with a semiconductor layer including a channel formation region. The insulating layer 4541 may be formed using a material and a method similar to those of the insulating layer 112 described in the above embodiment. Further, a protective insulating layer 4514 is formed over the insulating layer 4541. The insulating layer 4514 may be formed using a material and a method similar to those of the insulating layer 116 described in the above embodiment. Here, a silicon nitride layer is formed as the protective insulating layer 4514 by a PCVD method.

Further, an insulating layer 4544 functioning as a planarization insulating layer, by which surface roughness of the transistor is reduced, is formed over the protective insulating layer 4514. The insulating layer 4544 may be formed using a material and a method similar to those of the insulating layer 4021 described in Embodiment 6. Here, an acrylic resin is used for the planarization insulating layer 4544.

Moreover, reference numeral 4511 denotes a light-emitting element. A first electrode layer 4517 which is a pixel electrode included in the light-emitting element 4511 is electrically connected to a source or drain electrode layer of the transistor 4510. Note that the structure of the light-emitting element 4511 is, but not limited to, the stacked structure of the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is formed using an organic resin layer, an inorganic insulating layer, or organic polysiloxane. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective layer may be formed over the second electrode layer 4513 and the partition 4520 in order to prevent oxygen, hydrogen, moisture, carbon dioxide, or the like from entering the light-emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from an FPC 4518a and an FPC 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the transistors 4509 and 4510.

The connection terminal electrode 4515 is electrically connected to a terminal included in the FPC 4518a through an anisotropic conductive layer 4519.

The substrate located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, an ultraviolet curable resin or a thermosetting resin can be used, in addition to an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. For example, nitrogen may be used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Through the above-described process, a light-emitting display device (display panel) can be manufactured.

The transistors including an oxide semiconductor layer to which hydrogen is supplied, which are described in the above embodiments, have high field-effect mobility. When a light-emitting display device is manufactured using such a transistor as in this embodiment, a light-emitting display device having excellent display characteristics is realized.

This embodiment can be implemented in combination with any of the structures described in the other embodiments as appropriate.

Embodiment 8

An example of electronic paper will be described as an embodiment of the semiconductor device.

The thin film transistors whose on-state current and field-effect mobility are increased by supply of hydrogen can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. For example, electrophoretic displays contain a plurality of microcapsules dispersed in a solvent or a solute, and each microcapsule contains first particles which are positively charged and second particles which are negatively charged. By application of an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

An electrophoretic display is thus a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the microcapsules are arranged as appropriate over an active matrix substrate so as to be interposed between two electrodes, an active matrix display device can be completed, and thus display can be performed by application of an electric field to the microcapsules. As the active matrix substrate, an active matrix substrate using any of the transistors including an oxide semiconductor layer to which hydrogen is supplied, which are described in the above embodiments, can be used, for example.

Note that the first particles and the second particles in the microcapsules can be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of such a material.

Figure 10:
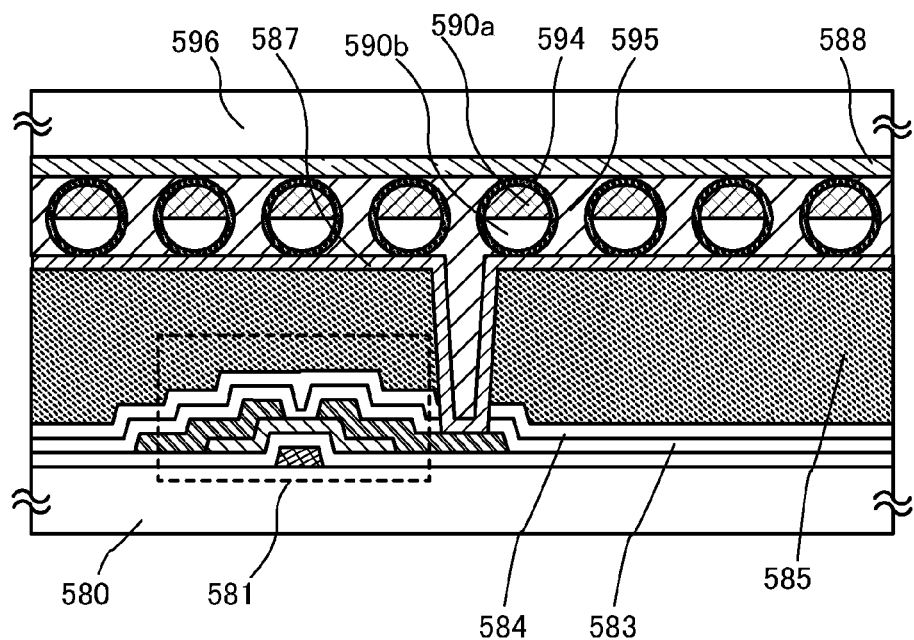
FIG. 10 is a cross-sectional view illustrating an embodiment of the present invention.

FIG. 10 illustrates active matrix electronic paper as an example of the semiconductor device. A transistor 581 used in the semiconductor device can be manufactured in a manner similar to that of the transistors of the above embodiments and is a transistor having high mobility which include an oxide semiconductor layer to which hydrogen is supplied. In addition, an insulating layer 584 is an insulating film containing hydrogen and is provided for supplying hydrogen to an oxide semiconductor material.

The electronic paper in FIG. 10 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 formed over a substrate 580 is a transistor having a bottom gate structure and is covered with an insulating layer 583 which is in contact with the semiconductor layer. A source or drain electrode layer of the transistor 581 is in contact with a first electrode layer 587 at an opening formed in the insulating layer 583, the insulating layer 584, and an insulating layer 585, whereby the transistor 581 is electrically connected to the first electrode layer 587. Spherical particles exist between the first electrode layer 587 and a second electrode layer 588 provided on a substrate 596. The spherical particles each include a black region 590a, a white region 590b, and a cavity 594 filled with liquid around the regions. A space around the cavity 594 is filled with a filler 595 such as a resin (see FIG. 10).

The first electrode layer 587 and the second electrode layer 588 correspond to a pixel electrode and a common electrode, respectively. The second electrode layer 588 is electrically connected to a common potential line provided over the same insulating substrate as the transistor 581. With the use of a common connection portion, the second electrode layer 588 and the common potential line can be electrically connected to each other through conductive particles provided between the pair of substrates.

Further, instead of the twisting ball, an electrophoretic element may be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

Through the above-described process, electronic paper can be manufactured.

In this embodiment, a so-called electronic paper is manufactured using a transistor described in any of the above embodiments. The transistor has high field-effect mobility, and when electronic paper is manufactured using the transistor, the electronic paper can have excellent display characteristics.

This embodiment can be implemented in combination with any of the structures described in the other embodiments as appropriate.

Embodiment 9

A semiconductor device disclosed in this specification can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio playback device, a large-sized game machine such as a pinball machine, and the like.

In this embodiment, examples of an electronic device on which a display device obtained in any one of Embodiments 6 to 8 is mounted will be described with reference to FIGS. 11A to 11E and FIG. 12.

Figure 11A:
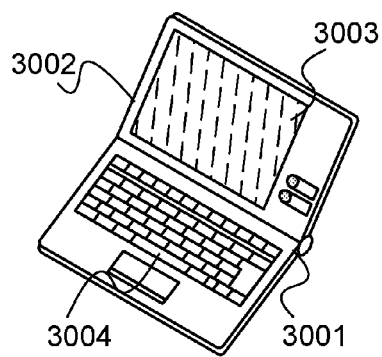
FIGS. 11A to 11E illustrate examples of electronic devices.

FIG. 11A illustrates a laptop personal computer manufactured by mounting at least a display device as a component, which includes a main body 3001, a housing 3002, a display portion 3003, a keyboard 3004, and the like. Note that the laptop personal computer includes the liquid crystal display device described in Embodiment 6.

Figure 11D:
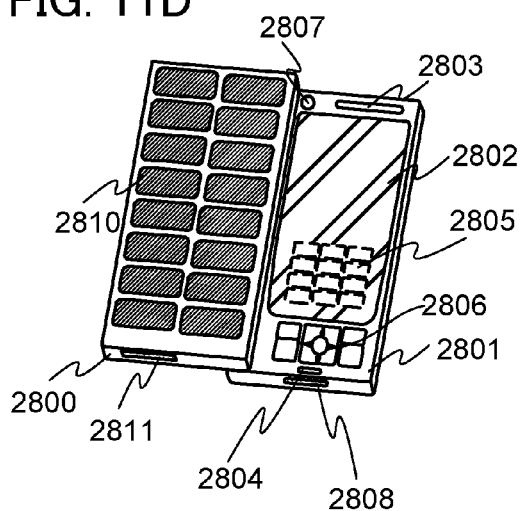
Figure 11B:
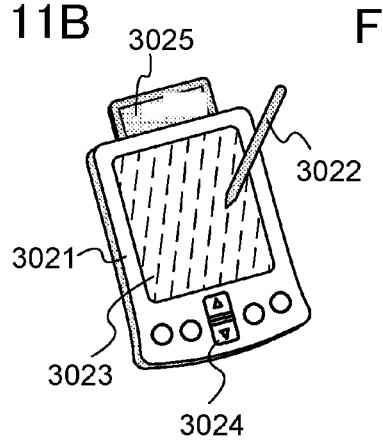

FIG. 11B is a portable information terminal (PDA) manufactured by mounting at least a display device as a component. A main body 3021 is provided with a display portion 3023, an external interface 3025, an operation button 3024, and the like. A stylus 3022 is included as an accessory for operation. Note that the portable information terminal includes the light-emitting display device described in Embodiment 7.

Figure 11E:
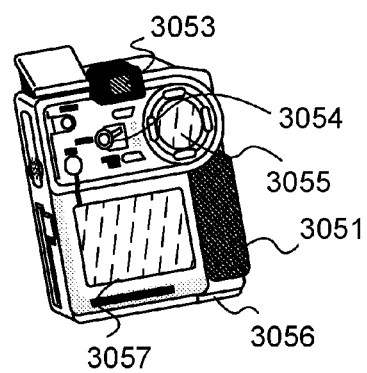
Figure 11C:
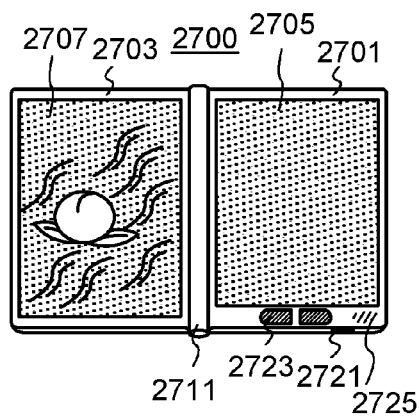

FIG. 11C illustrates an e-book reader on which the electronic paper described in Embodiment 8 is mounted as a component. FIG. 11C illustrates an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With this structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 11C) can display text and the left display portion (the display portion 2707 in FIG. 11C) can display graphics.

FIG. 11C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 11D is a mobile phone manufactured by mounting at least a display device as a component, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 is provided with a solar cell 2810 for charging the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 11D. The display panel 2802 is also mounted with a booster circuit for raising a voltage output from the solar cell 2810 to a voltage needed for each circuit.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

FIG. 11E is a digital camera manufactured by mounting at least a display device as a component, which includes a main body 3051, a display portion (A) 3057, an eyepiece 3053, operation switches 3054, a display portion (B) 3055, a battery 3056, and the like.

Figure 12:
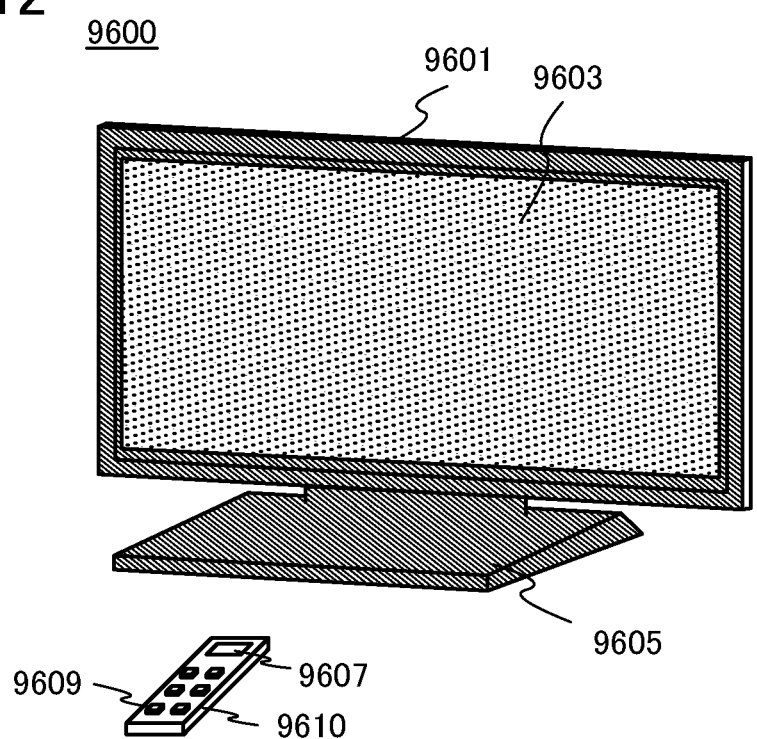
FIG. 12 illustrates an example of an electronic device.

FIG. 12 illustrates a television device 9600. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels and volume can be switched and controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

A plurality of transistors described in any of the above embodiments is provided as pixel switching elements in the display portion 9603, and a transistor having high mobility described in any of the above embodiments is disposed in a driver circuit which is formed over the same insulating substrate as the pixel portion 9603.

This embodiment can be freely combined with any one of Embodiments 1 to 8.

This application is based on Japanese Patent Application serial no. 2009-279002 filed with Japan Patent Office on Dec. 8, 2009, the entire contents of which are hereby incorporated by reference.

EXPLANATION OF REFERENCE

100: substrate, 101: conductive layer, 102: insulating layer, 106: oxide semiconductor layer, 108: conductive layer, 112: insulating layer, 113: insulating layer, 116: insulating layer, 114: gate electrode layer, 118: insulating layer, 150: transistor, 101*a*: gate electrode layer, 106*a*: oxide semiconductor layer, 108*a*: drain electrode layer, 580: substrate, 581: transistor, 583: insulating layer, 584: insulating layer, 587: electrode layer, 588: electrode layer, 594: cavity, 595: filler, 596: substrate, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation keys, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switches, 3055: display portion (B), 3056: battery, 3057: display portion (A), 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4014: insulating layer, 4015: connection terminal electrode, 4016: terminal electrode, 4018: FPC, 4019: anisotropic conductive layer, 4020: insulating layer, 4021: insulating layer, 4030: pixel electrode layer, 4031: counter electrode layer, 4032: insulating layer, 4040: conductive layer, 4501: substrate, 4502: pixel portion, 4505: sealant, 4506: substrate, 4507: filler, 4509: transistor, 4510: transistor, 4511: light-emitting element, 4512: electroluminescent layer, 4513: electrode layer, 4514: protective insulating layer, 4515: connection terminal electrode, 4516: terminal electrode, 4517: electrode layer, 4519: anisotropic conductive layer, 4520: partition, 4540: conductive layer, 4541: insulating layer, 4544: insulating layer, 590a: black region, 590b: white region, 9600: television device, 9601: housing, 9603: display portion, 9605: stand, 9607: display portion, 9609: operation key, 9610: remote controller, 4503a: signal line driver circuit, 4504a: scan line driver circuit, and 4518a: FPC.

What is claimed is:

1. A method for manufacturing a semiconductor device, the method comprising the steps of:
   forming a gate electrode;
   forming a first insulating layer over the gate electrode;
   forming an oxide semiconductor layer over the first insulating layer; and
   performing a first heat treatment after forming the oxide semiconductor layer;
   wherein the first heat treatment is performed first in an inert gas atmosphere and then in a gas comprising oxygen.

2. The method according to claim 1, wherein the oxide semiconductor layer comprises indium and zinc.

3. The method according to claim 2, wherein the oxide semiconductor layer further comprises gallium.

4. The method according to claim 1, wherein the oxide semiconductor layer comprises a crystalline region having a crystal grain size greater than or equal to 1 nm and less than or equal to 20 nm.

5. The method according to claim 1, further comprising the step of forming a source electrode and a drain electrode over the oxide semiconductor layer after performing the first heat treatment.

6. The method according to claim 1, wherein the inert gas atmosphere is switched to the gas comprising oxygen during the first heat treatment.

7. The method according to claim 1, the method further comprising the steps of:
   forming a second insulating layer over the oxide semiconductor layer;
   forming a third insulating layer comprising hydrogen over the second insulating layer; and
   after forming the third insulating layer, performing a second heat treatment so that hydrogen in the third insulating layer is supplied to at least the oxide semiconductor layer.

8. The method according to claim 7, wherein the third insulating layer is a silicon nitride layer.

9. A method for manufacturing a semiconductor device, the method comprising the steps of:
   forming a gate electrode;
   forming a first insulating layer over the gate electrode;
   forming an oxide semiconductor layer over the first insulating layer; and
   performing a first heat treatment after forming the oxide semiconductor layer;
   wherein the first heat treatment is performed first in an inert gas atmosphere and then in a gas comprising oxygen, and
   wherein the first heat treatment is a gas rapid thermal annealing process.

10. The method according to claim 9, wherein the oxide semiconductor layer comprises indium and zinc.

11. The method according to claim 10, wherein the oxide semiconductor layer further comprises gallium.

12. The method according to claim 9, wherein the oxide semiconductor layer comprises a crystalline region having a crystal grain size greater than or equal to 1 nm and less than or equal to 20 nm.

13. The method according to claim 9, further comprising the step of forming a source electrode and a drain electrode over the oxide semiconductor layer after performing the first heat treatment.

14. The method according to claim 9, wherein the inert gas atmosphere is switched to the gas comprising oxygen during the first heat treatment.

15. The method according to claim 9, the method further comprising the steps of:
   forming a second insulating layer over the oxide semiconductor layer;
   forming a third insulating layer comprising hydrogen over the second insulating layer; and
   after forming the third insulating layer, performing a second heat treatment so that hydrogen in the third insulating layer is supplied to at least the oxide semiconductor layer.

16. The method according to claim 15, wherein the third insulating layer is a silicon nitride layer.

17. A method for manufacturing a semiconductor device, the method comprising the steps of:
   forming a gate electrode;
   forming a first insulating layer over the gate electrode;
   forming an oxide semiconductor layer over the first insulating layer; and
   performing a first heat treatment after forming the oxide semiconductor layer;
   wherein the first heat treatment is performed first in an inert gas atmosphere and then in a gas comprising oxygen, and
   wherein the first heat treatment is performed at a temperature higher than or equal to 650° C. and lower than or equal to 700° C.

18. The method according to claim 17, wherein the oxide semiconductor layer comprises indium and zinc.

19. The method according to claim 18, wherein the oxide semiconductor layer further comprises gallium.

20. The method according to claim 17, wherein the oxide semiconductor layer comprises a crystalline region having a crystal grain size greater than or equal to 1 nm and less than or equal to 20 nm.

21. The method according to claim 17, further comprising the step of forming a source electrode and a drain electrode over the oxide semiconductor layer after performing the first heat treatment.

22. The method according to claim 17, wherein the inert gas atmosphere is switched to the gas comprising oxygen during the first heat treatment.

23. The method according to claim 17, the method further comprising the steps of:
forming a second insulating layer over the oxide semiconductor layer;
forming a third insulating layer comprising hydrogen over the second insulating layer; and
after forming the third insulating layer, performing a second heat treatment so that hydrogen in the third insulating layer is supplied to at least the oxide semiconductor layer.

24. The method according to claim 23, wherein the third insulating layer is a silicon nitride layer.

25. A method for manufacturing a semiconductor device, the method comprising the steps of:
forming an oxide semiconductor layer on an insulating surface;
forming an oxide insulating film containing oxygen over the oxide semiconductor layer;
after forming the oxide insulating film, performing a heat treatment to supply oxygen to the oxide semiconductor layer; and
after performing the heat treatment, forming a first insulating film comprising silicon nitride over the oxide insulating film.

26. The method according to claim 25, wherein the first insulating film contains hydrogen.

27. The method according to claim 25, wherein the oxide insulating film is in direct contact with the oxide semiconductor layer.

28. The method according to claim 25, wherein the oxide insulating film comprises silicon oxide.

29. The method according to claim 25, wherein the oxide semiconductor layer comprises indium, zinc, and oxygen.

30. The method according to claim 25, wherein the oxide insulating film has a thickness within a range from 50 to 200 nm.

31. The method according to claim 25, wherein the heat treatment is performed at a temperature higher than or equal to 200° C. and lower than or equal to 450° C.

32. The method according to claim 25, wherein the oxide semiconductor layer has crystallinity.

33. A method for manufacturing a semiconductor device, the method comprising the steps of:
forming an oxide semiconductor layer on an insulating surface;
forming an oxide insulating film containing oxygen over the oxide semiconductor layer;
after forming the oxide insulating film, performing a heat treatment to supply oxygen to the oxide semiconductor layer from the oxide insulating film; and
after performing the heat treatment, forming a first insulating film comprising silicon nitride over the oxide insulating film.

34. The method according to claim 33, wherein the first insulating film contains hydrogen.

35. The method according to claim 33, wherein the oxide insulating film is in direct contact with the oxide semiconductor layer.

36. The method according to claim 33, wherein the oxide insulating film comprises silicon oxide.

37. The method according to claim 33, wherein the oxide semiconductor layer comprises indium, zinc, and oxygen.

38. The method according to claim 33, wherein the oxide insulating film has a thickness within a range from 50 to 200 nm.

39. The method according to claim 33, wherein the heat treatment is performed at a temperature higher than or equal to 200° C. and lower than or equal to 450° C.

40. The method according to claim 33, wherein the oxide semiconductor layer has crystallinity.

41. A method for manufacturing a semiconductor device, the method comprising the steps of:
forming a gate electrode over a substrate;
forming a gate insulating layer over the gate electrode;
forming an oxide semiconductor layer over the gate electrode with the gate insulating layer interposed therebetween;
forming an oxide insulating film containing oxygen over the oxide semiconductor layer;
after forming the oxide insulating film, performing a heat treatment to supply oxygen to the oxide semiconductor layer; and
after performing the heat treatment, forming a first insulating film comprising silicon nitride over the oxide insulating film.

42. The method according to claim 41, wherein the first insulating film contains hydrogen.

43. The method according to claim 41, wherein the oxide insulating film is in direct contact with the oxide semiconductor layer.

44. The method according to claim 41, wherein the oxide insulating film comprises silicon oxide.

45. The method according to claim 41, wherein the oxide semiconductor layer comprises indium, zinc, and oxygen.

46. The method according to claim 41, wherein the oxide insulating film has a thickness within a range from 50 to 200 nm.

47. The method according to claim 41, wherein the heat treatment is performed at a temperature higher than or equal to 200° C. and lower than or equal to 450° C.

48. The method according to claim 41, wherein the oxide semiconductor layer has crystallinity.

49. A method for manufacturing a semiconductor device, the method comprising the steps of:
forming a gate electrode over a substrate;
forming a gate insulating layer over the gate electrode;
forming an oxide semiconductor layer over the gate electrode with the gate insulating layer interposed therebetween;
forming an oxide insulating film containing oxygen over the oxide semiconductor layer;
after forming the oxide insulating film, performing a heat treatment to supply oxygen to the oxide semiconductor layer from the oxide insulating film; and
after performing the heat treatment, forming a first insulating film comprising silicon nitride over the oxide insulating film.

50. The method according to claim 49, wherein the first insulating film contains hydrogen.

51. The method according to claim 49, wherein the oxide insulating film is in direct contact with the oxide semiconductor layer.

52. The method according to claim 49, wherein the oxide insulating film comprises silicon oxide.

53. The method according to claim 49, wherein the oxide semiconductor layer comprises indium, zinc, and oxygen.

54. The method according to claim 49, wherein the oxide insulating film has a thickness within a range from 50 to 200 nm.

55. The method according to claim 49, wherein the heat treatment is performed at a temperature higher than or equal to 200° C. and lower than or equal to 450° C.

56. The method according to claim 49, wherein the oxide semiconductor layer has crystallinity.

* * * * *